US012560862B2

(12) United States Patent
Jeong et al.

(10) Patent No.: US 12,560,862 B2
(45) Date of Patent: Feb. 24, 2026

(54) SUBSTRATE TREATING APPARATUS AND SUBSTRATE TREATING METHOD

(71) Applicant: SEMES CO., LTD., Cheonan-si (KR)

(72) Inventors: Ji Hoon Jeong, Hwaseong-si (KR);
Young Dae Chung, Incheon (KR);
Hyun Yoon, Seoul (KR)

(73) Assignee: Semes Co., Ltd., Chungcheongnam-do (KR)

( * ) Notice: Subject to any disclaimer, the term of this patent is extended or adjusted under 35 U.S.C. 154(b) by 658 days.

(21) Appl. No.: 18/148,051

(22) Filed: Dec. 29, 2022

(65) Prior Publication Data

US 2023/0213852 A1 Jul. 6, 2023

(30) Foreign Application Priority Data

Dec. 31, 2021 (KR) ......................... 10-2021-0193594
Apr. 26, 2022 (KR) ......................... 10-2022-0051639

(51) Int. Cl.
*G03F 1/78* (2012.01)
*G03F 1/70* (2012.01)

(52) U.S. Cl.
CPC . *G03F 1/78* (2013.01); *G03F 1/70* (2013.01)

(58) Field of Classification Search
CPC ..... G03F 1/78; G03F 1/70; G03F 1/84; G03F 1/72; G03F 1/36; G03F 7/168; H01L 21/67069; H01L 21/0275; H01L 21/30604; H01L 21/3083; H01L 21/3086; H01L 21/681; H01L 21/682
See application file for complete search history.

(56) References Cited

FOREIGN PATENT DOCUMENTS

| KR | 10-2008-0099582 A | 11/2008 |
| KR | 10-2010-0084045 A | 7/2010 |
| KR | 101279578 B1 | 6/2013 |
| KR | 10-2019-0037379 A | 4/2019 |
| KR | 102008311 B1 | 8/2019 |
| KR | 102014917 B1 | 8/2019 |
| KR | 10-2020-0127072 A | 11/2020 |
| KR | 102172957 B1 | 11/2020 |
| KR | 102173947 B1 | 11/2020 |
| KR | 10-2021-0071135 A | 6/2021 |

OTHER PUBLICATIONS

Korean Office Action dated Jul. 22, 2024 issued in corresponding Korean Patent Appln. No. 10-2022-0051639.

*Primary Examiner* — Robert G Bachner
(74) *Attorney, Agent, or Firm* — Harness, Dickey & Pierce, P.L.C.

(57) ABSTRACT

Disclosed is a method of treating a substrate, the method including: supplying a liquid to the substrate, emitting a laser to the substrate supplied with the liquid to heat the substrate, and emitting imaging light for capturing the substrate to obtain an image of the substrate including a region to which the laser is emitted, in which the laser and the imaging light are emitted to the substrate through a head lens, and a divergence angle of the laser emitted from the head lens and a divergence angle of the imaging light are matched with each other.

13 Claims, 15 Drawing Sheets

SUBSTRATE TREATING APPARATUS AND SUBSTRATE TREATING METHOD

CROSS-REFERENCE TO RELATED APPLICATIONS

This application claims priority to and the benefit of Korean Patent Application No. 10-2021-0193594 and 10-2022-0051639 filed in the Korean Intellectual Property Office on Dec. 31, 2021 and Apr. 26, 2022 the entire contents of which are incorporated herein by reference.

TECHNICAL FIELD

The present invention relates to a substrate treating apparatus and a substrate treating method, and more particularly, to a substrate treating apparatus and a substrate treating method, which treat a substrate by heating the substrate.

BACKGROUND ART

A photography process for forming a pattern on a wafer includes an exposure process. The exposure process is a preliminary operation for scraping a semiconductor integrated material adhered on the wafer into a desired pattern. The exposure process may have various purposes, such as forming a pattern for etching and forming a pattern for ion implantation. In the exposure process, a pattern is drawn with light on the wafer by using a mask, which is a kind of 'frame'. When the semiconductor integrated material on a wafer, for example, a resist on the wafer, is exposed to light, chemical properties of the resist are changed according to a pattern by the light and the mask. When a developer is supplied to the resist whose chemical properties are changed according to the pattern, a pattern is formed on the wafer.

In order to precisely perform the exposure process, the pattern formed on the mask needs to be precisely manufactured. Whether the pattern is formed satisfactorily under the required process conditions needs to be checked. A large number of patterns are formed on one mask. Accordingly, it takes a lot of time for an operator to inspect all of a large number of patterns in order to inspect one mask. Accordingly, a monitoring pattern that may represent one pattern group including a plurality of patterns is formed on the mask. In addition, an anchor pattern that may represent a plurality of pattern groups is formed on the mask. The operator may estimate the quality of the patterns included in one pattern group through the inspection of the monitoring pattern. In addition, the operator may estimate the quality of the patterns formed on the mask through the inspection of the anchor pattern.

In addition, in order to increase the inspection accuracy of the mask, it is preferable that the critical dimensions of the monitoring pattern and the anchor pattern are the same. A critical dimension correction process for precisely correcting the line widths of the patterns formed on the mask is additionally performed.

FIG. 1 illustrates a normal distribution with respect to a first critical dimension CDP1 of a monitoring pattern and a second critical dimension CDP2 of an anchor pattern of a mask before a critical dimension correction process is performed during a mask manufacturing process. In addition, the first critical dimension CDP1 and the second critical dimension CDP2 have sizes smaller than a target critical dimension. Before the critical dimension correction process is performed, there is a deliberate deviation in the Critical Dimensions (CDs) of the monitoring pattern and the anchor pattern. Then, by additionally etching the anchor pattern in the critical dimension correction process, the critical dimensions of the two patterns are made the same. When the anchor pattern is over-etched than the monitoring pattern in the process of additionally etching the anchor pattern, the critical dimension of the patterns formed on the mask cannot be precisely corrected due to the difference in the critical dimension between the monitoring pattern and the anchor pattern. When the anchor pattern is additionally etched, precise etching of the anchor pattern needs to be accompanied.

In the process of etching the anchor pattern, a treatment liquid is supplied to a mask, and the anchor pattern formed on the mask supplied with the treatment liquid is heated by using a laser. In order to accompany precise etching of the anchor pattern, laser needs to be precisely emitted to a specific area where the anchor pattern is formed. Since the treatment liquid is already supplied and the laser is emitted to the mask on which the liquid film is formed, the laser emitted by the liquid film is refracted. Therefore, it is difficult to emit the laser to an accurate irradiation position corresponding to the anchor pattern formed on the mask. This acts as a major factor in generating serious process defects in the CD correction process, which does not allow errors in nm units. In addition, various types of treatment liquids are supplied to the mask, and each treatment liquid has a different refractive index. This results in a problem that makes precise irradiation of the laser on the anchor pattern more difficult.

SUMMARY OF THE INVENTION

The present invention has been made in an effort to provide a substrate treating apparatus and method capable of performing precise etching on a substrate.

The present invention has also been made in an effort to provide a substrate treating apparatus and method capable of performing selective etching on a specific region of a substrate.

The present invention has also been made in an effort to provide a substrate treating apparatus and method capable of performing precise etching on a specific region of a substrate by using a capturing focus for capturing an image of the substrate.

The present invention has also been made in an effort to provide a substrate treating apparatus and method capable of performing precise etching on a specific region of a substrate regardless of the type of liquid film formed on the substrate.

The problem to be solved by the present invention is not limited to the above-mentioned problems, and the problems not mentioned will be clearly understood by those skilled in the art from the present specification and the accompanying drawings.

An exemplary embodiment of the present invention provides a substrate treating method, including: supplying a liquid to the substrate, emitting a laser to the substrate supplied with the liquid to heat the substrate, and emitting imaging light for capturing the substrate to obtain an image of the substrate including a region to which the laser is emitted, in which the laser and the imaging light are emitted to the substrate through a head lens, and a divergence angle of the laser emitted from the head lens and a divergence angle of the imaging light are matched with each other.

According to the exemplary embodiment, the liquid may be supplied to the substrate to form a liquid film, and the laser may be emitted to the substrate on which the liquid film is formed, and a focus of the imaging light may be adjusted based on the substrate between the substrate and the liquid film.

According to the exemplary embodiment, the head lens may be movably provided, and a focus of the imaging light may be adjusted by moving the head lens to change a distance between the head lens and an top surface of the substrate.

According to the exemplary embodiment, the focus of the imaging light may be adjusted by changing the divergence angle of the imaging light emitted from the head lens.

According to the exemplary embodiment, the divergence angle of the laser emitted from the head lens may be changed by an expander, and the divergence angle of the laser emitted from the head lens may be changed by the expander to be matched to the changed divergence angle of the imaging light.

According to the exemplary embodiment, a direction of the laser emitted from the head lens to the substrate and a direction of the imaging light emitted from the head lens to the substrate may be coaxial with each other.

Another exemplary embodiment of the present invention provides a substrate treating method of treating a mask including a plurality of cells, the substrate treating method including: supplying a liquid to a mask in which a first pattern is formed in the plurality of cells and a second pattern different from the first pattern is formed outside the region where the cells are formed, heating the mask by emitting a laser to the mask supplied with the liquid, and obtaining an image of the mask including a region irradiated with the laser by emitting imaging light for capturing the mask, in which the laser and the imaging light are emitted to the substrate through a head lens, and a divergence angle of the laser emitted from the head lens and a divergence angle of the imaging light are matched with each other.

According to the exemplary embodiment, a liquid film may be formed by supplying the liquid to the mask, and the laser is emitted to the mask formed with the liquid film, and a focus of the imaging light may be adjusted based on the mask between the mask and the liquid film.

According to the exemplary embodiment, the head lens may be movably provided, and the focus of the imaging light may be adjusted by moving the head lens to change a distance between the head lens and an upper surface of the mask.

According to the exemplary embodiment, the focus of the imaging light may be adjusted by changing the divergence angle of the imaging light emitted from the head lens.

According to the exemplary embodiment, the divergence angle of the laser emitted from the head lens may be changed by an expander, and the divergence angle of the laser emitted from the head lens may be changed by the expander to be matched to the changed divergence angle of the imaging light.

According to the exemplary embodiment, a direction of the laser emitted from the head lens to the substrate and a direction of the imaging light emitted from the head lens to the substrate may be coaxial with each other.

According to the exemplary embodiment, the laser may be emitted to the second pattern between the first pattern and the second pattern.

Still another exemplary embodiment of the present invention provides an apparatus for treating a substrate, the apparatus including: a support unit for supporting the substrate; a liquid supply unit for supplying a liquid to the substrate supported by the support unit; a laser unit including a head lens; and a controller for controlling the laser unit, in which the laser unit includes: an emitting member for heating the substrate supported by the support unit by emitting a laser through the head lens; and an imaging member for obtaining an image of the substrate including a region to which the laser is emitted by emitting imaging light through the head lens to capture the substrate, and the controller controls the emitting member and the imaging member so that a divergence angle of the laser emitted from the head lens is matched to a divergence angle of the imaging light.

According to the exemplary embodiment, the liquid supply unit may supply the liquid to the substrate to form a liquid film, the emitting member may emit the laser to the substrate on which the liquid film is formed, and the controller may control the imaging member to adjust a focus of the imaging light based on the substrate between the substrate and the liquid film.

According to the exemplary embodiment, the head lens may be movably provided, and the controller may adjust the focus of the imaging light by moving the head lens to change a distance between the head lens and an top surface of the substrate.

According to the exemplary embodiment, the controller may adjust the focus of the imaging light emitted to the substrate by changing a divergence angle of the imaging light emitted from the head lens.

According to the exemplary embodiment, the emitting member may include: an oscillating unit for emitting the laser; and an expander including a plurality of lenses, and the controller may change the divergence angle of the laser emitted from the head lens by changing a distance between the plurality of lenses to be matched to the changed divergence angle of the imaging light.

According to the exemplary embodiment, the laser unit may be provided so that a direction of the laser emitted from the head lens to the substrate and a direction of the imaging light emitted from the head lens to the substrate are coaxial with each other.

According to the exemplary embodiment, in the substrate, a first pattern may be formed in a plurality of cells, and a second pattern different from the first pattern is formed outside a region where the cells are formed, and the emitting member may emit the laser to the second pattern between the first pattern and the second pattern.

According to the exemplary embodiment of the present invention, it is possible to perform precise etching on a substrate.

Further, according to the exemplary embodiment of the present invention, it is possible to perform selective etching on a specific region of a substrate.

In addition, according to the exemplary embodiment of the present invention, precise etching of a specific region of a substrate may be performed by using an imaging focus for capturing an image of the substrate.

In addition, according to the exemplary embodiment of the present invention, precise etching may be performed on a specific region of a substrate regardless of the type of liquid film formed on the substrate.

The effect of the present invention is not limited to the foregoing effects, and those skilled in the art may clearly understand non-mentioned effects from the present specification and the accompanying drawings.

DETAILED DESCRIPTION

Figure 1:
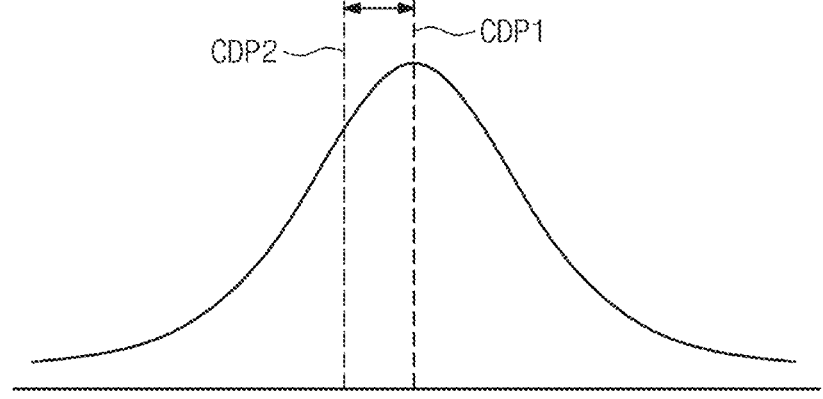
FIG. 1 is a diagram illustrating a normal distribution with respect to a critical dimension of a monitoring pattern and a critical dimension of an anchor pattern.

Hereinafter, an exemplary embodiment of the present invention will be described in more detail with reference to the accompanying drawings. An exemplary embodiment of the present invention may be modified in various forms, and the scope of the present invention should not be construed as being limited by the exemplary embodiment described below. The present exemplary embodiment is provided to more completely explain the present invention to those skilled in the art. Therefore, the shapes of components in the drawings are exaggerated to emphasize a clearer description.

Terms, such as first and second, are used for describing various constituent elements, but the constituent elements are not limited by the terms. The terms are used only to discriminate one constituent element from another constituent element. For example, without departing from the scope of the invention, a first constituent element may be named as a second constituent element, and similarly a second constituent element may be named as a first constituent element.

Figure 2:
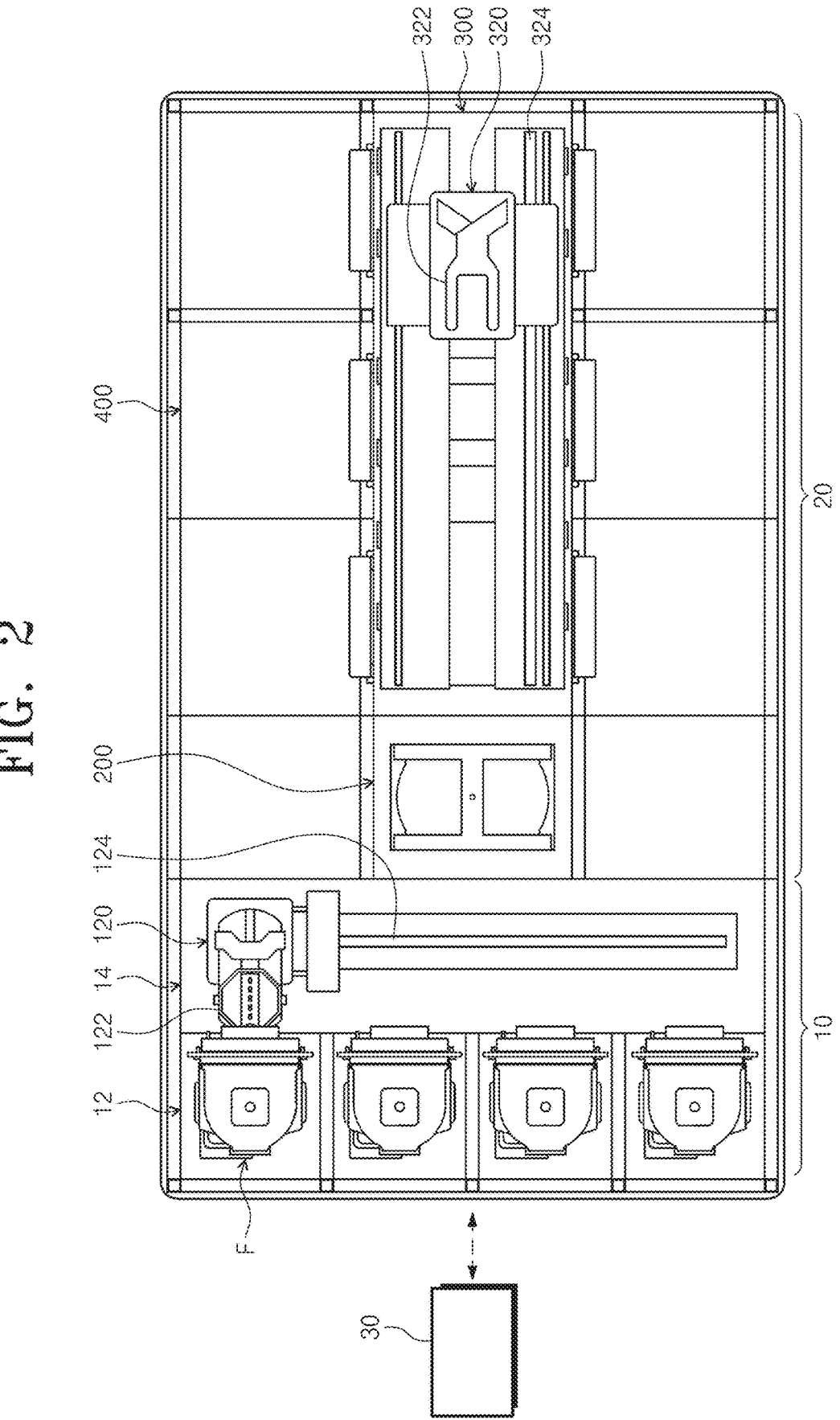
FIG. 2 is a top plan view schematically illustrating a substrate treating apparatus according to an exemplary embodiment of the present invention.

Hereinafter, an exemplary embodiment of the present invention will be described in detail with reference to FIGS. 2 to 16. FIG. 2 is a top plan view schematically illustrating a substrate treating apparatus according to an exemplary embodiment of the present invention.

Referring to FIG. 2, a substrate treating apparatus 1 includes an index module 10, a treating module 20, and a controller 30. According to the exemplary embodiment, the index module 10 and the treating module 20 may be disposed along one direction when viewed from the top.

Hereinafter, the direction in which the index module 10 and the treating module 20 are arranged is defined as a first direction X, when viewed from the top, a direction perpendicular to the first direction X is defined to as a second direction Y, and a direction perpendicular to a plane including both the first direction X and the second direction Y is defined as a third direction Z.

The index module 10 transfers the substrate M. The index module 10 transfers the substrate M between the treating module 20 and the container F containing the substrate M. For example, the index module 10 transfers the substrate M, which has undergone a predetermined process in the treating module 20, to the container F. For example, the index module 10 transfers the substrate M, which has undergone a predetermined process in the treating module 20, to the container F. A longitudinal direction of the index module 10 may be formed in the second direction Y.

The index module 10 may have a load port 12 and an index frame 14. A container F in which the substrate M is accommodated is seated in the load port 12. The load port 12 may be located on the opposite side of the treating module 20 with respect to the index frame 14. A plurality of load ports 12 may be provided. The plurality of load ports 12 may be arranged in a line along the second direction Y. The number of load ports 120 may be increased or decreased according to process efficiency of the treating module 20 and a condition of foot print, and the like.

As the container C, an airtight container, such as a Front Opening Unfed Pod (FOUP) may be used. The container F may be placed on the load port 12 by a transfer means (not illustrated), such as an overhead transfer, an overhead conveyor, or an automatic guided vehicle, or an operator.

The index frame 14 provides a transfer space for transferring the substrate M. An index robot 120 and an index rail 124 are provided in the transfer space of the index frame 14. The index robot 120 transfers the substrate M. The index robot 120 may transfer the substrate M between the index module 10 and a buffer unit 200 to be described later. The index robot 120 has an index hand 122.

The substrate M is placed on the index hand 122. The index hand 122 may be provided to be capable of moving in a forward direction and a backward direction, rotating in a vertical direction as an axis, and moving along an axial direction. A plurality of index hands 122 may be provided. Each of the plurality of index hands 122 may be spaced apart in the vertical direction. A plurality of index hands 122 may be provided to move in the forward direction and the backward direction independently of each other.

The index rail 124 is provided in the transferring space of the index frame 14. A longitudinal direction of the index rail 124 is provided along the second direction Y. An index robot 120 is placed on the index rail 124, and the index robot 120 is provided to be linearly movable on the index rail 124. That is, the index robot 120 is capable of moving in the forward direction and the backward direction on the index rail 124.

The controller 30 may control the substrate treating apparatus 1. The controller 30 may include a process controller formed of a microprocessor (computer) that executes the control of the substrate treating apparatus 1, a user interface formed of a keyboard in which an operator performs a command input operation or the like in order to manage the substrate treating apparatus 1, a display for visualizing and displaying an operation situation of the substrate treating apparatus 1, and the like, and a storage unit storing a control program for executing the process executed in the substrate treating apparatus 1 under the control of the process controller or a program, that is, a treating recipe, for executing the process in each component according to various data and treating conditions. Further, the user interface and the storage unit may be connected to the process controller. The treating recipe may be stored in a storage medium in the storage unit, and the storage medium may be a hard disk, and may also be a portable disk, such as a CD-ROM or a DVD, or a semiconductor memory, such as a flash memory.

The controller 30 may control configurations of the substrate treating apparatus 1 to perform a substrate treating method described below. For example, the controller 30 may control the configurations provided to the liquid treating chamber 400 to be described later.

The treating module 20 may include a buffer unit 200, a transfer frame 300, and a liquid treating chamber 400.

The buffer unit 200 provides a space in which the substrate M loaded to the treating module 20 and the substrate M unloaded from the treating module 20 temporarily stay. The buffer unit 200 may be disposed between the index frame 14 and the transfer frame 300. The buffer unit 200 may be located at one end of the transfer frame 300. A slot (not illustrated) in which the substrate M is placed is provided inside the buffer unit 200. A plurality of slots (not illustrated) may be provided. A plurality of slots (not illustrated) may be spaced apart from each other in a vertical direction.

A front face and a rear face of the buffer unit 200 are opened. The front face is a surface facing the index frame 14, and the rear face is a surface facing the transfer frame 300. The index robot 120 may approach the buffer unit 200 through the front face, and a transfer robot 320 to be described later may approach the buffer unit 200 through the rear face.

The transfer frame 300 provides a space for transferring the substrate M between the buffer unit 200 and the liquid treating chamber 400. A longitudinal direction of the transfer chamber 300 may be provided in the first direction X. The liquid treating chambers 400 may be disposed on the sides of the transfer frame 300. That is, the transfer frame 300 and the liquid treating chamber 400 may be disposed along the second direction Y. According to the exemplary embodiment, the liquid treating chambers 400 may be disposed on both sides of the transfer frame 300. On one side of the transfer frame 300, the liquid treating chambers 400 may be provided in an arrangement of A×B (A and B are each 1 or a natural number greater than 1) in each of the first direction X and the third direction Z.

The transfer frame 300 includes the transfer robot 320 and a transfer rail 324. The transfer robot 320 transfers the substrate M. The transfer robot 320 transfers the substrate M between the buffer unit 200 and the liquid treating chamber 400. The transfer robot 320 includes a transfer hand 322 on which the substrate M is placed. The substrate M may be placed on the transfer hand 322. The transfer hand 322 may be provided to be capable of moving in the forward direction and the backward direction, rotating in a vertical direction as an axis, and moving along an axial direction. A plurality of hands 322 is provided while being spaced apart in the vertical direction, and the plurality of hands 322 may move in the forward and backward directions independently of each other.

The transfer rail 324 may be provided inside the transfer frame 300 along the longitudinal direction of the transfer frame 300. For example, a longitudinal direction of the transfer rail 324 may be provided in the first direction X. The transfer robot 320 is placed on the transfer rail 324, and the transfer robot 320 is provided to be movable on the transfer rail 324.

Figure 3:
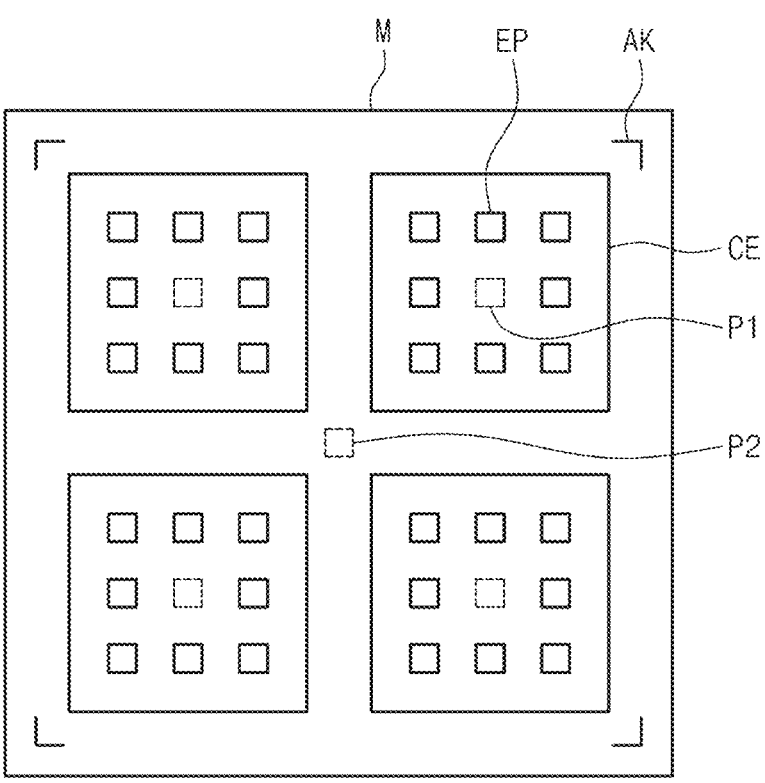
FIG. 3 is a diagram schematically illustrating a substrate treated in a liquid treating chamber of FIG. 2 viewed from the top.

FIG. 3 is a diagram schematically illustrating a substrate treated in the liquid treating chamber of FIG. 2 viewed from the top. Hereinafter, the substrate M treated in the liquid treating chamber 400 according to the exemplary embodiment of the present invention will be described in detail with reference to FIG. 3.

Referring to FIG. 3, an object to be treated in the liquid treating chamber 400 may be a substrate of any one of a wafer, a glass, and a photomask. For example, the substrate M treated in the liquid treating chamber 400 according to the exemplary embodiment of the present invention may be a photo mask that is a 'frame' used in the exposure process. For example, the substrate M may have a quadrangular shape. A reference mark AK, a first pattern P1, and a second pattern P2 may be formed on the substrate M.

At least one reference mark AK may be formed on the substrate M. For example, a plurality of reference marks AK may be formed in each edge region of the substrate M. The reference mark AK may be a mark used for aligning the substrate M called an align key. In addition, the reference mark AK may be a mark used to derive position information of the substrate M. For example, a imaging member 700 to be described later may capture the reference mark AK and acquire an image of the reference mark AK, and transmit the acquired image to the controller 30. The controller 30 may analyze the image including the reference mark AK to detect the exact position of the substrate M. Also, the reference mark AK may be used to recognize the position of the substrate M when the substrate M is transferred.

A cell CE may be formed on the substrate M. At least one cell CE may be formed. A plurality of patterns may be formed in each of the plurality of cells CE. A plurality of patterns may be formed in each of the plurality of cells CE. The patterns formed in each cell CE may be defined as one pattern group. The patterns formed in each cell CE may include an exposure pattern EP and a first pattern P1.

The exposure pattern EP may be used to form an actual pattern on the substrate M. The first pattern P1 may be a pattern representative of the exposure patterns EP formed in one cell CE. Further, when the cell CE is provided in plurality, the first pattern P1 may be provided in plurality.

For example, each of the plurality of cells CE may be provided with the first pattern P1. However, the present invention is not limited thereto, and a plurality of first patterns P1 may be formed in one cell CE.

The first pattern P1 may have a shape in which portions of the respective exposure patterns EP are combined. The first pattern P1 may be referred to as a monitoring pattern. An average value of the critical dimensions of the plurality of first patterns P1 may be referred to as a Critical Dimension Monitoring Macro (CDMM).

When an operator inspects the first pattern P1 formed in any one cell CE through a Scanning Electron Microscope (SEM), whether the shape of the exposure patterns EP formed in any one cell CE is satisfactory may be estimated. Accordingly, the first pattern P1 may function as a pattern for inspection. Unlike the above-described example, the first pattern P1 may be any one of the exposure patterns EP participating in the actual exposure process. Optionally, the first pattern P1 may be a pattern for inspection and a pattern participating in the actual exposure process at the same time.

The second pattern P2 may be formed outside the cells CE formed on the substrate M. For example, the second pattern P2 may be located outside the region in which the plurality of cells CE is provided. The second pattern P2 may be a pattern representative of the exposure patterns EP formed on the substrate M. At least one second pattern P2 may be provided. For example, a plurality of second patterns P2 may be provided. The plurality of second patterns P2 may be arranged in a serial arrangement and/or a parallel arrangement. Optionally, the plurality of second patterns P2 may have a shape in which parts of the first patterns P1 are combined.

When an operator inspects the second pattern P2 through the SEM, whether the shape of the exposure patterns EP formed on one substrate M is satisfactory may be estimated. Accordingly, the second pattern P2 may function as a pattern for inspection. The second pattern P2 may be a pattern for inspection that does not participate in the actual exposure process. The second pattern P2 may be a pattern for setting process conditions of an exposure apparatus. The second pattern P2 may be referred to as an anchor pattern.

Hereinafter, the liquid treating chamber 400 according to the exemplary embodiment of the present invention will be described in detail. In addition, hereinafter, the present invention will be described based on an example in which the treatment performed in the liquid treating chamber 400 is a Fine Critical Dimension Correction (FCC) in the process of manufacturing the mask for the exposure process.

The substrate M treated in the liquid treating chamber 400 may be the substrate M on which a pre-treatment has been performed. Critical dimensions of the first pattern P1 and the second pattern P2 formed on the substrate M loaded into the liquid treating chamber 400 may be different from each other. According to the exemplary embodiment, the critical dimension of the first pattern P1 may be relatively larger than the critical dimension of the second pattern P2. For example, the critical dimension of the first pattern P1 may have a first width (for example, 69 nm), and the critical dimension of the second pattern P2 may have a second width (for example, 68.5 nm).

Figure 4:
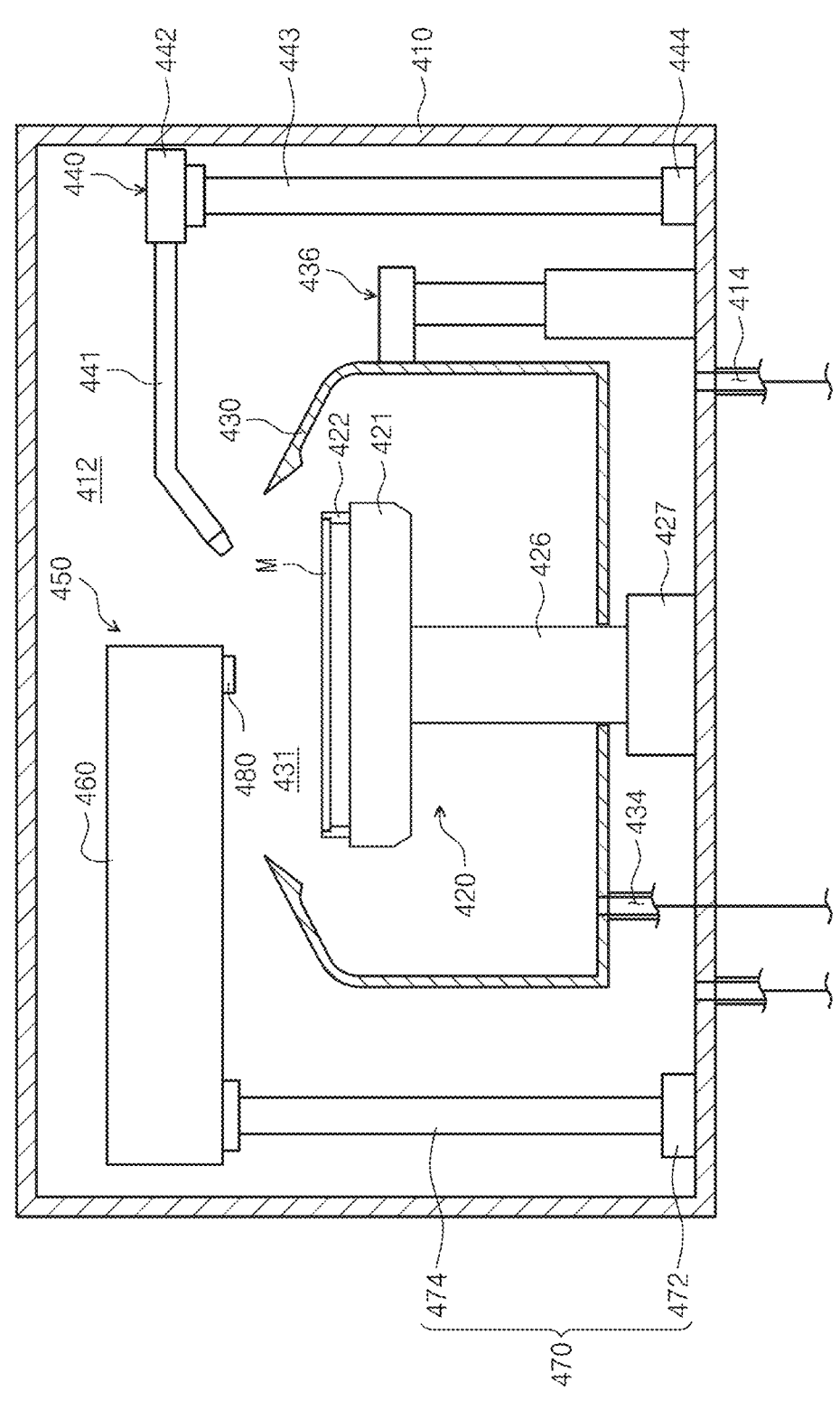
FIG. 4 is a diagram schematically illustrating an exemplary embodiment of the liquid treating chamber of FIG. 2.
Figure 5:
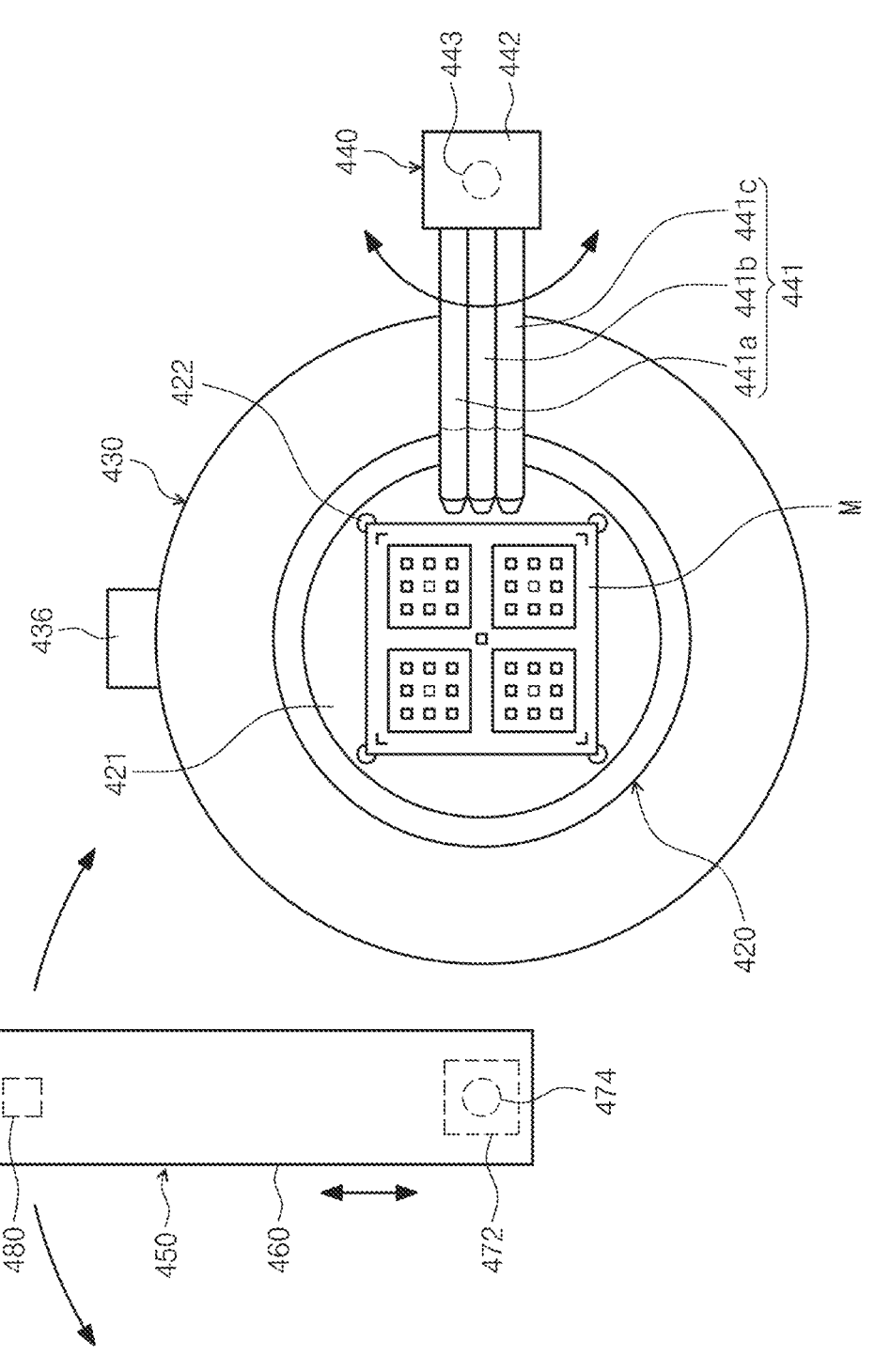
FIG. 5 is a diagram illustrating the liquid treating chamber according to the exemplary embodiment of FIG. 4 viewed from the top.

FIG. 4 is a diagram schematically illustrating an exemplary embodiment of the liquid treating chamber of FIG. 2. FIG. 5 is a diagram illustrating the liquid treating chamber according to the exemplary embodiment of FIG. 4 viewed from the top. Referring to FIGS. 4 and 5, the liquid treating chamber 400 may include a housing 410, a support unit 420, a treating container 430, a liquid supply unit 440, and a laser unit 450.

The housing 410 has an inner space 412. The support unit 420, the treating container 430, the liquid supply unit 440, and the laser unit 450 are provided in the inner space 412. An opening (not illustrated) through which the substrate M is carried in and out may be formed in the housing 410. The inner wall surface of the housing 410 may be coated with a material having high corrosion resistance to the liquid supplied by the liquid supply unit 440.

An exhaust hole 414 is formed in the bottom surface of the housing 410. The exhaust hole 414 may be connected to a pressure reducing member (not illustrated). For example, the pressure reducing member (not illustrated) may be provided as a pump. The exhaust hole 414 exhausts the atmosphere of the inner space 412. In addition, the exhaust hole 414 discharges byproducts, such as particles, generated in the inner space 412 to the outside of the inner space 412.

The support unit 420 supports the substrate M in the inner space 412. Also, the support unit 420 rotates the substrate M. The support unit 420 supports and rotates the substrate M in a treating space 431 to be described later. The support unit 420 may include a body 421, a support pin 422, a support shaft 426, and a driver 427.

The body 421 may be generally provided in a plate shape. The body 421 may have a plate shape having a predetermined thickness. When viewed from the top, the body 421 may have an upper surface provided in a generally circular shape. The upper surface of the body 421 may have a relatively larger area than the substrate M.

The support unit 422 supports the substrate M. The support pins 422 may support the substrate M so that the lower surface of the substrate M and the upper surface of the body 421 are spaced apart from each other. The support pin 422 may have a generally circular shape when viewed from above. When viewed from above, the support pin 422 may have a shape in which a portion corresponding to a corner region of the substrate M is recessed downward.

The support pin 422 may have a first face and a second face. For example, the first face may support the lower portion of the edge region of the substrate M. The second face may face the side of the edge region of the substrate M. Accordingly, when the substrate M is rotated, the movement of the substrate M in the lateral direction may be restricted by the second face.

A plurality of support pins 422 is provided. The support pins 422 may be provided in a number corresponding to the number of edge regions of the substrate M having a quadrangular shape. For example, four support pins 422 may be provided.

The support shaft 426 is coupled with the body 421. The support shaft 426 is located below the body 421. The support shaft 426 may be moved vertically by the driver 427. The support shaft 426 may be rotated by the driver 427. The driver 4522 may be a motor. When the driver 427 rotates the support shaft 426, the body 421 coupled to the support shaft 426 may be rotated. The substrate M may be rotated along with the rotation of the body 421 through the support pin 422.

The support shaft 426 may be a hollow shaft. Also, the driver 427 may be a hollow motor. A fluid supply line (not illustrated) may be formed inside the hollow shaft to supply a fluid to the lower portion of the substrate M. The fluid supplied to the lower portion of the substrate M may be a chemical, a rinsing solution, or inert gas. However, unlike the above example, a fluid supply line (not illustrated) may not be provided inside the support shaft 426.

The treating vessel 430 has a treating space 431. The treating container 430 has a treating space 431 in which the substrate M is treated. The treating container 430 may have a cylindrical shape with an open top. The substrate M may be subjected to liquid treatment and heat treatment in the treatment space. The treating container 430 may prevent the liquid supplied to the substrate M from scattering to the housing 410, the liquid supply unit 440, and the laser unit 450.

An opening into which the support shaft 426 is inserted may be formed in the bottom surface of the treating container 430 when viewed from the top. A discharge hole 434 through which the liquid supplied by the liquid supply unit 440 is dischargeable to the outside may be formed on the bottom surface of the treating container 430. A side surface of the treating container 430 may extend upward from the bottom surface. The upper end of the treating container 430 may be inclined. For example, an upper end of the treating container 430 may extend upwardly with respect to the ground toward the substrate M supported by the support unit 420.

The treating container 430 is coupled to a lifting member 436. The lifting member 436 may move the treating container 430 up and down. The lifting member 436 may be a driving device capable of moving the treating container 430 up and down. The lifting member 436 may move the treating container 430 in the upper direction while the liquid treatment or the heat treatment is performed on the substrate M. In this case, an upper end of the treating container 430 may be positioned relatively higher than an upper end of the substrate M supported by the support unit 420. When the substrate M is loaded into the inner space 412 and when the substrate M is unloaded from the inner space 412, the lifting member 436 may move the treating container 430 in the lower direction.

The liquid supply unit 440 supplies a liquid onto the substrate M. The liquid supply unit 440 supplies a liquid on the substrate M to form a liquid film. The liquid supplied to the substrate M by the liquid supply unit 440 may be provided as a treatment liquid. For example, the treatment liquid may be provided as an etching solution or a rinsing solution. The etching solution may be a chemical. The etching solution may etch the pattern formed on the substrate M. The etching solution may be referred to as an etchant. The etchant may be a liquid containing hydrogen peroxide and a mixture in which ammonia, water, and an additive are mixed. The rinsing solution may clean the substrate M. The rinsing solution may be provided as a known chemical liquid.

The liquid supply unit 440 may include a nozzle 441, a fixed body 442, a rotating shaft 443, and a rotating driver 444.

The nozzle 441 may supply a liquid to the substrate M supported by the support unit 420. One end of the nozzle 441 may be coupled to the fixed body 442, and the other end of the nozzle 441 may extend from the fixed body 442 in a direction toward the substrate M. The other end of the nozzle 441 may be bent at a predetermined angle and extended in a direction toward the substrate M supported by the support unit 420.

As illustrated in FIG. 5, the nozzle 441 may include a first nozzle 441*a*, a second nozzle 441*b*, and a third nozzle 441*c*. The first nozzle 441*a*, the second nozzle 441*b*, and the third nozzle 441*c* may supply different types of liquid to the substrate M. For example, any one of the first nozzle 441*a*, the second nozzle 441*b*, and the third nozzle 441*c* may supply the chemical among the above-described treatment liquids. Further, another one of the first nozzle 441*a*, the second nozzle 441*b*, and the third nozzle 441*c* may supply a rinsing solution among the above-described treatment liquids. Another one of the first nozzle 441*a*, the second nozzle 441*b*, and the third nozzle 441*c* may supply different types of chemicals from those supplied by any one of the first nozzle 441*a*, the second nozzle 441*b*, and the third nozzle 441*c*.

The fixed body 442 may fix and support the nozzle 441. The fixed body 442 may be coupled to the rotating shaft 443. One end of the rotating shaft 443 is coupled to the fixed body 442, and the other end of the rotating shaft 443 is coupled to the rotating driver 444. The rotating driver 444 rotates the rotating shaft 443. The rotating shaft 443 may have a vertical longitudinal direction. The rotating shaft 443 may be rotated based on a vertical axis. When the rotating driver 444 rotates the rotating shaft 443, the fixed body 442 may be rotated based on the vertical axis. Accordingly, the discharge ports of the nozzles 441*a*, 441*b*, and 441*c* may be moved between a liquid supply position, which is a position where a liquid is supplied to the substrate M, and a standby position, which is a position where a liquid is not supplied to the substrate M.

Figure 6:
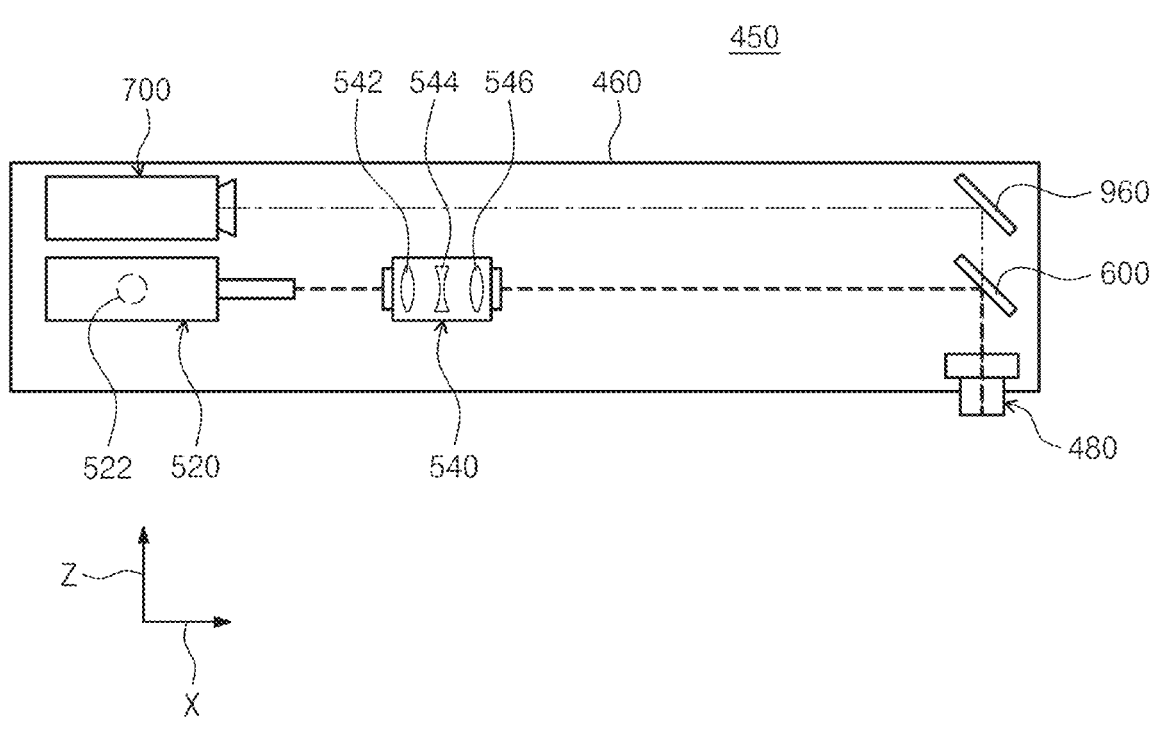
FIG. 6 is a diagram schematically illustrating a side view of a laser unit according to the exemplary embodiment of FIG. 4.
Figure 7:
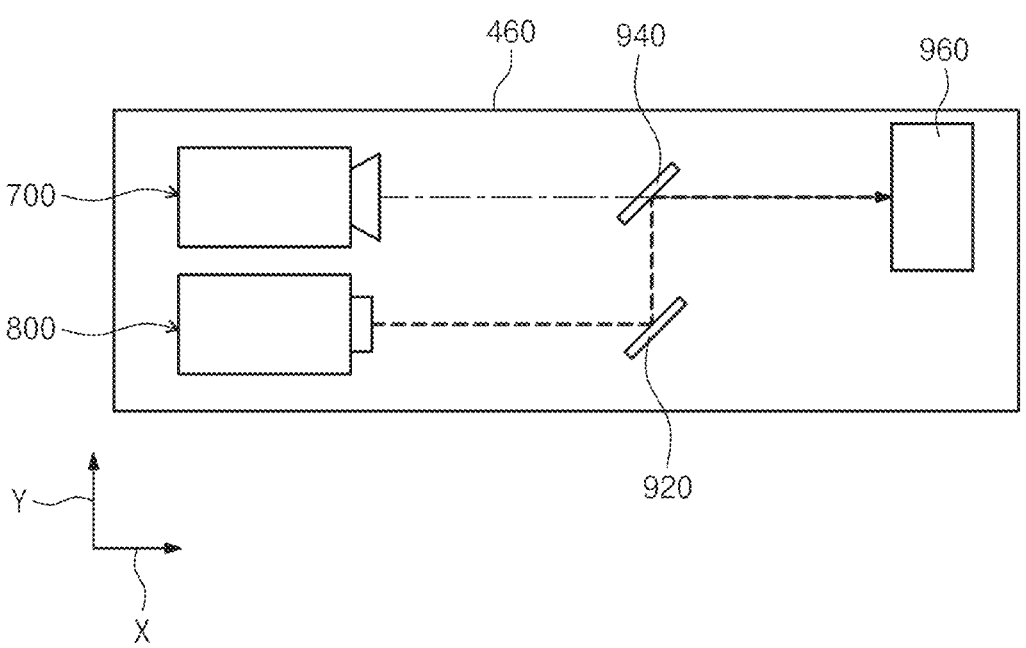
FIG. 7 is a diagram schematically illustrating a view of the laser unit according to the exemplary embodiment of FIG. 6 viewed from the top.

FIG. 6 is a diagram schematically illustrating a side view of a laser unit according to the exemplary embodiment of FIG. 4. FIG. 7 is a diagram schematically illustrating a view of the laser unit according to the exemplary embodiment of FIG. 6 viewed from the top. Hereinafter, a laser unit according to the exemplary embodiment of the present invention will be described in detail with reference to FIGS. 4 to 7.

As illustrated in FIG. 4, the laser unit 450 is located in the inner space 412. The laser unit 450 heats the substrate M. The laser unit 450 may heat the substrate M to which the liquid is supplied. For example, after the liquid is supplied onto the substrate M by the liquid supply unit 440, the laser unit 450 may heat a specific region of the substrate M by emitting light to the substrate M on which the liquid film is formed. For example, the laser unit 450 may irradiate light to the second pattern P2 formed on a specific region of the substrate M. For example, the light emitted to the substrate M by the laser unit 450 may be a laser. The temperature of the specific region of the substrate M irradiated with the laser may increase. Accordingly, the degree of etching by the liquid for the second pattern P2 of the region irradiated with the laser may increase. Also, the laser unit 450 may obtain an image of the laser emitted onto the substrate M. For example, the laser unit 450 may obtain an image of the substrate M including a laser irradiation area where the laser is emitted to the substrate M.

The laser unit 450 may include a housing 460, a moving member 470, a head lens 480, an emitting member 500, a lower reflective plate 600, the imaging member 700, a lighting member 800, and an upper reflective member 900.

As illustrated in FIGS. 6 and 7, the housing 460 provides an installation space therein. The installation space of the housing 460 may provide a sealed environment from the outside. A portion of the head lens 480, the emitting member 500, the imaging member 700, and the lighting member 800 may be positioned in the installation space of the housing 460. The emitting member 500, the imaging member 700, and the lighting member 800 located in the installation space of the housing 460 are protected from byproducts generated or the liquid splashed during the process. Each of the head lens 480, the emitting member 500, the imaging member 700, and the lighting member 800 may be modularized and provided by the housing 460.

An opening may be formed in a lower portion of the housing 460. The head lens 480 to be described below may be inserted into the opening of the housing 460. The head lens 480 is inserted into the opening of the housing 460, so that the lower end of the head lens 480 may be positioned while protruding from the lower end of the housing 460, as illustrated in FIGS. 4 and 6.

Referring to FIGS. 4 and 5, the moving member 470 is coupled to the housing 460. The moving member 470 moves the housing 460. When the housing 460 is moved by the moving member 470, the head lens 480 inserted into the housing 460 may be moved. The moving member 470 may include a driver 472 and a shaft 474.

The driver 4522 may be a motor. The driver 4522 may be connected to the shaft 472. The driver 472 may move the shaft 474 in the vertical direction. Also, the driver 472 may rotate the shaft 474. Although not illustrated, the driver 472 according to the exemplary embodiment may be provided in plurality. One of the plurality of drivers may be provided as a rotary motor for rotating the shaft 474, and the other of the plurality of drivers may be provided as a linear motor for moving the shaft 474 in the vertical direction.

The Shaft 474 is coupled with the housing 460. As the shaft 474 is rotated by the driver 472, the housing 460 is also rotated. Accordingly, the position of the head lens 480 to be described later may also be changed on the horizontal plane. In addition, as the shaft 474 is moved in the vertical direction by the driver 472, the housing 460 is also moved in the vertical direction. Accordingly, the height of the head lens 480 to be described later may also be changed on a horizontal plane.

The head lens 480 may include an objective lens and a lens barrel. A laser emitted from the emitting member 500 described later may be emitted to the substrate M through the head lens 480. Specifically, the head lens 480 may receive the laser from the emitting member 500 and emit the received laser to the substrate M supported by the support unit 420. In addition, imaging light emitted from the imaging member 700 to be described later may be emitted to the substrate M through the head lens 480. Specifically, the head lens 480 may receive imaging light from the imaging member 700 and emit the received imaging light to the substrate M supported by the support unit 420. In addition, lighting provided by the lighting member 800 to be described below may be transmitted to the substrate M through the head lens 480.

When viewed from above, the center of the head lens 480 may be moved while drawing an arc. When viewed from above, the center of the head lens 480 may be moved so as to pass the center of the substrate M supported by the support unit 420. The head lens 480 may be moved between an irradiation position and a standby position by the moving member 470.

The irradiation position may be a position where the substrate M is heated by emitting a laser onto the substrate M. According to an example, the irradiation position may be an upper portion of the second pattern P2 formed on the substrate M supported by the support unit 420. According to one example, the standby location may be an area outside the treating container 430. In addition, a home port (not illustrated) is provided at the standby position, and maintenance work on the configurations included in the laser unit 450 may be performed at the home port (not illustrated).

Referring back to FIGS. 6 and 7, the emitting member 500 may deliver a laser to the head lens 480. The emitting member 500 may include an oscillating unit 520 and an expander 540. The oscillating unit 520 emits a laser. The oscillating unit 520 may emit a laser toward the expander 540. The output of the laser emitted from the oscillating unit 520 may be changed according to process requirements.

A tilting member 522 may be installed in the oscillating unit 520. The tilting member 522 may change the emission direction of the laser emitted from the oscillating unit 520. For example, the tilting member 522 may be provided by a motor. The tilting member 522 may rotate the oscillating unit 520 based on one axis. The tilting member 522 may rotate the oscillating unit 520 to tilt the emission direction of the laser emitted from the oscillating unit 520.

The expander 540 receives the laser emitted from the oscillating unit 520. The expander 540 may change a he profile of the laser transmitted from the oscillating unit 520. The profile refers to characteristics of a laser, such as intensity of the laser, a diameter of the laser, a shape of the laser, and/or focal dispersion of the laser. According to one exemplary embodiment, the expander 540 may be provided as a variable Beam Expander Telescope (BET).

The expander 540 may include a plurality of lenses 542, 544, and 546. According to one exemplary embodiment, the expander 540 may include a first lens 542, a second lens 544, and a third lens 546. The first lens 542, the second lens 544, and the third lens 546 are located on the moving path of the laser emitted from the oscillating unit 520. The first lens 542, the second lens 544, and the third lens 546 may be sequentially disposed along a direction away from the oscillating unit 520. A laser emitted from the oscillating unit 520 may sequentially pass through the first lens 542, the second lens 544, and the third lens 546. The profile of the laser emitted from the oscillating unit 520 may be changed while passing through the first lens 542, the second lens 544, and the third lens 546.

According to the exemplary embodiment, the first lens 542 and the second lens 544 may be movably provided. The first lens 542 and the second lens 544 may move in the forward direction and the backward direction in a horizontal direction. The position of the third lens 546 may be fixed. When the first lens 542 and the second lens 544 are moved, the diameter of the laser transmitted to a lower reflective plate 600 described later and the head lens 480 described above may be changed. Accordingly, the divergence angle of the laser emitted from the head lens 480 may be changed. A divergence angle of a laser emitted from the head lens 480 may be matched with a divergence angle of imaging light emitted from the head lens 480 to be described later. The detailed mechanism for this will be described below.

According to the exemplary embodiment, the first lens 542 and the third lens 546 may be provided as convex lenses. Also, the second lens 544 may be provided as a concave lens. However, the present invention is not limited thereto, and each of the first lens 542, the second lens 544, and the third lens 546 may be provided as one of a concave lens and a convex lens. In addition, in the above example, the expander 540 has been described as including the first lens 542, the second lens 544, and the third lens 546 as an example, but the present invention is not limited thereto. For example, the expander 540 may include an integer number of 4 or more lenses.

The lower reflective plate 600 is located on the movement path of the laser emitted from the oscillating unit 520. According to the exemplary embodiment, when viewed from the side, the lower reflective plate 600 may be positioned at a height corresponding to that of the oscillating unit 520 and the expander 540. In addition, the lower reflective plate 600 may be positioned to overlap the head lens 480 when viewed from above.

Also, when viewed from above, the lower reflective 600 may be positioned to overlap an upper reflective 960 to be described later. The lower reflective plate 600 may be disposed lower than the upper reflective plate 960. The lower reflective plate 600 may be tilted at the same angle as the upper reflective plate 960.

The lower reflective plate 600 receives a laser from the expander 540. The lower reflective plate 600 may change the movement path of the laser emitted from the oscillating unit 520. The lower reflective plate 600 may change a moving path of the laser moving in the horizontal direction to a vertical downward direction. The laser whose movement path is changed in the vertical downward direction by the lower reflective plate 600 may be transmitted to the head lens 480. For example, the laser emitted from the oscillating unit 520 may sequentially pass through the expander 540, the lower reflective plate 600, and the head lens 480 to be emitted to the second pattern P2 formed on the substrate M.

The imaging member 700 captures the laser emitted to a target object and acquires an image of the target object. The imaging member 700 acquires an image of the laser emitted to the substrate M supported by the support unit 420. For example, the imaging member 700 may obtain an image of the substrate M including a region on the substrate M irradiated with the laser. In addition, the imaging member 700 may acquire an image by capturing the laser emitted to a home port (not illustrated).

The imaging member 700 may be provided as a camera module. According to the exemplary embodiment, the imaging member 700 may be a camera module whose focus is adjusted. Also, the imaging member 700 may be a camera module that emits visible light or far infrared rays. The image obtained by the imaging member 700 may be a video and/or a picture. Hereinafter, for convenience of understanding, visible light or far infrared rays emitted by the imaging member 700 for capturing are defined as imaging light. The imaging member 700 may emit the imaging light toward the upper reflective plate 960 to be described later. The imaging light transmitted to the upper reflective plate 960 is transmitted to the head lens 480, and the head lens 480 may irradiate the received imaging light toward the substrate M.

The imaging member 700 may transmit the acquired image to the controller 30. The controller 30 may monitor the profile of the laser emitted to the substrate M and/or the home port (not illustrated) by analyzing the image. Also, the controller 30 may monitor the shape of the liquid film supplied on the substrate M by analyzing the image. Also, the controller 30 may monitor the focus of the imaging light emitted onto the imaged substrate M. Also, the controller 30 may adjust the focus of the imaging light.

The lighting member 800 provides lighting so that imaging member 700 may easily obtain an image. The light provided by the lighting member 800 may be directed to a first reflective plate 920 to be described later. The lighting provided by the lighting member 800 may pass through the first reflective plate 920 and a second reflective plate 940 to be described later in order, and may be directed to the upper reflective plate 960 to be described later.

The upper reflective member 900 may include the first reflective plate 920, the second reflective plate 940, and the upper reflective plate 960.

The first reflective plate 920 and the second reflective plate 940 change the direction of the lighting provided by the lighting member 800. The first reflective plate 920 and the second reflective plate 940 may be installed at heights corresponding to each other. The first reflective plate 920 may reflect the lighting provided by the lighting member 800 in a direction toward the second reflective plate 940. The second reflective plate 940 may reflect light reflected from the first reflective plate 920 again in a direction toward the upper reflective plate 960. The lighting transmitted to the upper reflective plate 960 is transmitted to the head lens 480, and the head lens 480 may emit the received lighting in a direction toward the substrate M.

When viewed from above, the upper reflective plate 960 and the lower reflective plate 600 may be disposed to overlap each other. The upper reflective plate 960 may be disposed above the lower reflective plate 600. The upper reflective plate 960 and the lower reflective plate 600 may be tilted at the same angle.

The upper reflective plate 960 and the lower reflective plate 600 may make the direction of the emission of the laser emitted from the emitting member 500, the direction of the emission of the imaging light provided by the imaging member 700, and the direction of the lighting provided by the lighting member 800 have the same axis. Accordingly, the laser may be transmitted from the emitting member 500 to the head lens 480, the imaging light may be transmitted from the imaging member 700 to the head lens 480, and the lighting may be transmitted from the lighting member 800 to the head lens 480. That is, the laser, the imaging light, and the lighting may be radiated coaxially from the head lens 480.

Hereinafter, the substrate treating method according to the exemplary embodiment of the present invention will be described in detail. The substrate treating method described below may be performed in the liquid treating chamber 400. Also, the controller 30 may control the configurations of the liquid treating chamber 400 so that a substrate treating method described below may be performed.

Figure 8:
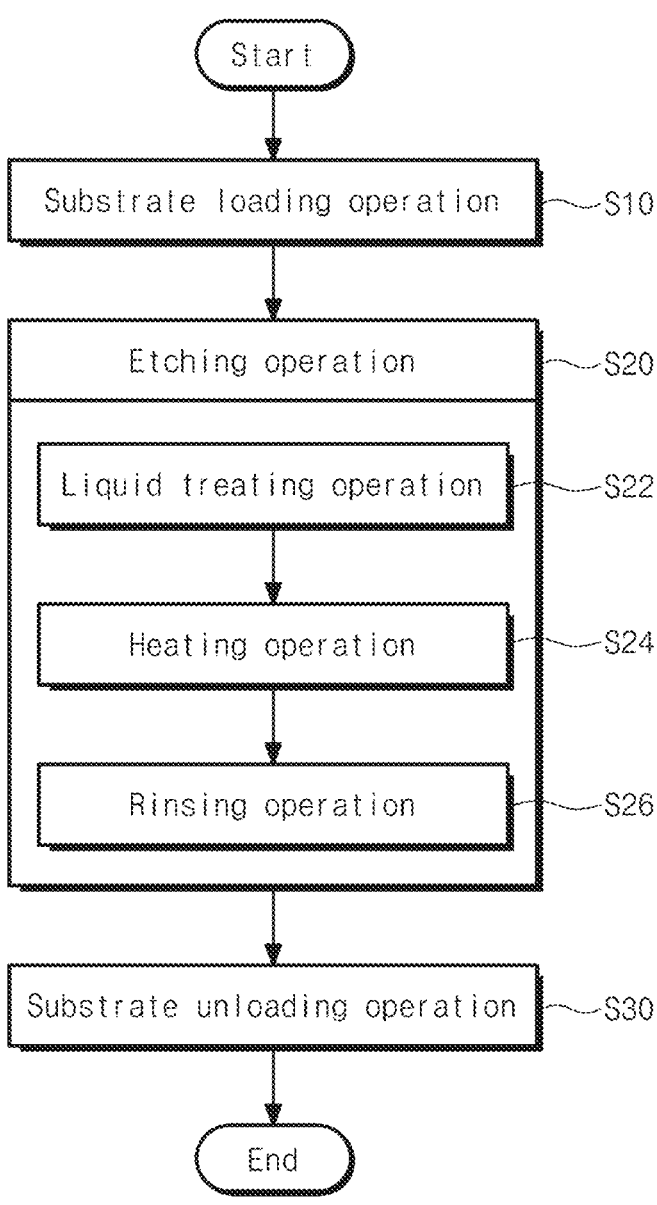
FIG. 8 is a flow chart illustrating a substrate treating method according to an exemplary embodiment of the present invention.

FIG. 8 is a flow chart illustrating a substrate treating method according to an exemplary embodiment of the present invention. Referring to FIG. 8, the substrate treating method according to the exemplary embodiment of the present invention may include a substrate loading operation S10, an etching operation S20, and a substrate unloading operation S30. The substrate loading operation S10, the etching operation S20, and the substrate unloading operation S30 are sequentially performed in chronological order.

In the substrate loading operation S10, the substrate M is loaded into the inner space 412 of the housing 410. For example, in the substrate loading operation S10, an entrance inlet (not illustrated) formed in the housing 410 may be opened by a door (not illustrated). The substrate M may be loaded into the inner space 412 of the housing 410 through the open entrance inlet (not illustrated). In the substrate loading operation S10, the transfer robot 320 illustrated in FIG. 2 may seat the substrate M on the support unit 420. Before the transfer robot 320 places the substrate M on the support unit 420, the lifting member 436 may move the treating container 430 in the lower direction. When the substrate M is seated on the support unit 420, the laser unit 450 illustrated in FIG. 4 may move to a process position.

The etching operation S20 performs an etching process on the pattern formed on the substrate M. According to the exemplary embodiment, in the etching operation S20, a critical dimension correction process of correcting a difference in critical dimension between the first pattern P1 and the second pattern P2 may be performed. For example, in the etching operation S20, the second pattern P2 formed on the substrate M may be etched so that a critical dimension of the first pattern P1 and the critical dimension of the second pattern P2 coincide with each other. The etching operation S20 may include a liquid treatment operation S22, a heating operation S24, and a rinsing operation S26. The liquid treatment operation S22, the heating operation S24, and the rinsing operation S26 may be sequentially performed.

Figure 9:
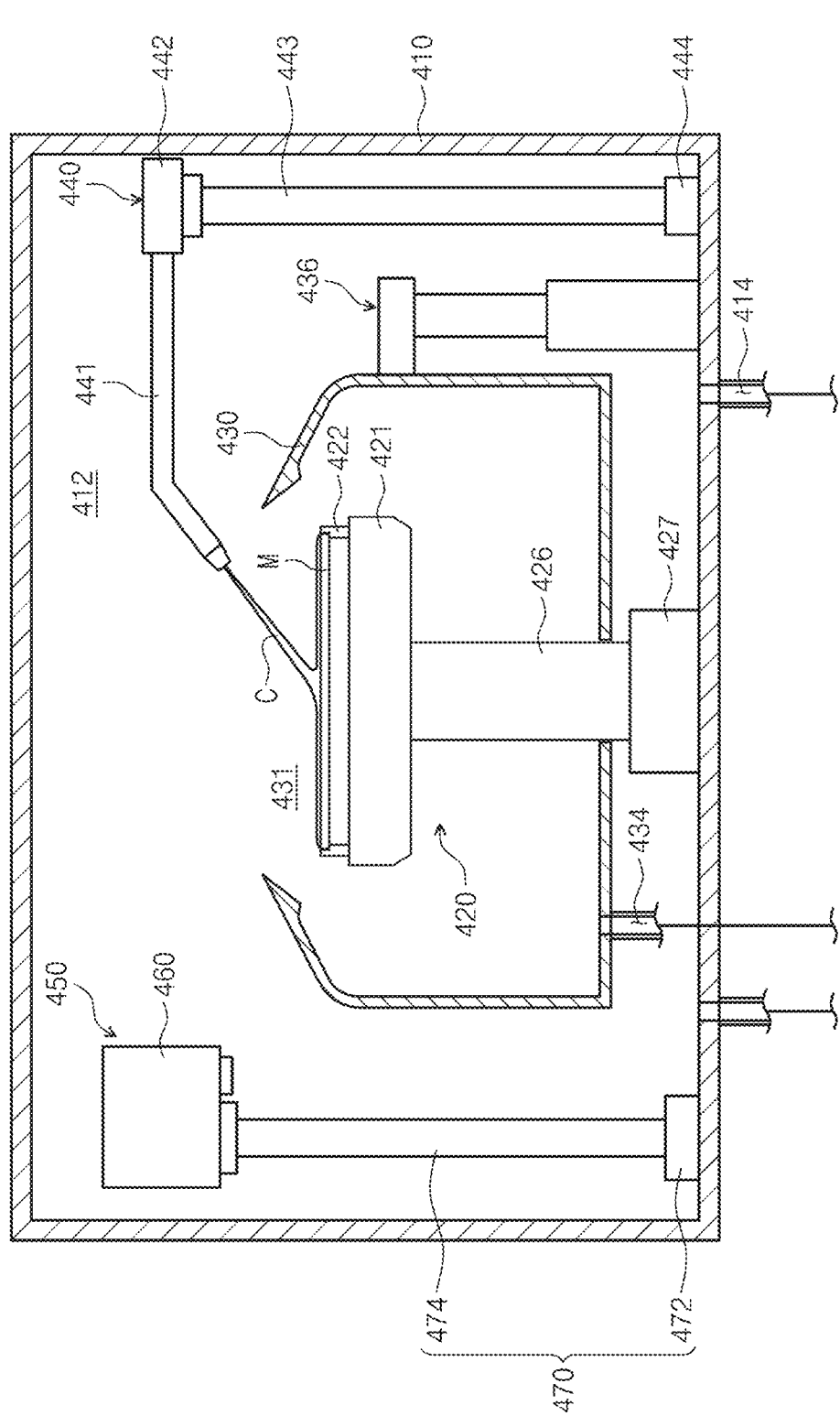
FIG. 9 is a diagram schematically illustrating the substrate treating apparatus performing a liquid treatment operation according to the exemplary embodiment of FIG. 8.

FIG. 9 is a diagram schematically illustrating the substrate treating apparatus performing the liquid treatment operation according to the exemplary embodiment of FIG. 8. Referring to FIG. 9, in the liquid treatment operation S22, the laser unit 450 may be located at a standby position and the liquid supply unit 440 may be located at a process position.

In the liquid treating operation S22, the liquid supply unit 440 may supply the treatment liquid to the substrate M. The treatment liquid supplied by the liquid supply unit 440 may be a chemical C that is an etchant. The amount of the chemical C supplied to the substrate M in the liquid treatment operation S22 may be supplied in an amount capable of forming a puddle of the chemical C. For example, the chemical C supplied in the liquid treatment operation S22 covers the entire top surface of the substrate M, and the chemical C may be supplied in the amount that does not flow down from the substrate M, or even if the chemical flows out, the amount of flowing chemical is insignificant. If necessary, the nozzle 441 may supply the chemical C to the entire top surface of the substrate M while changing the position thereof.

Figure 10:
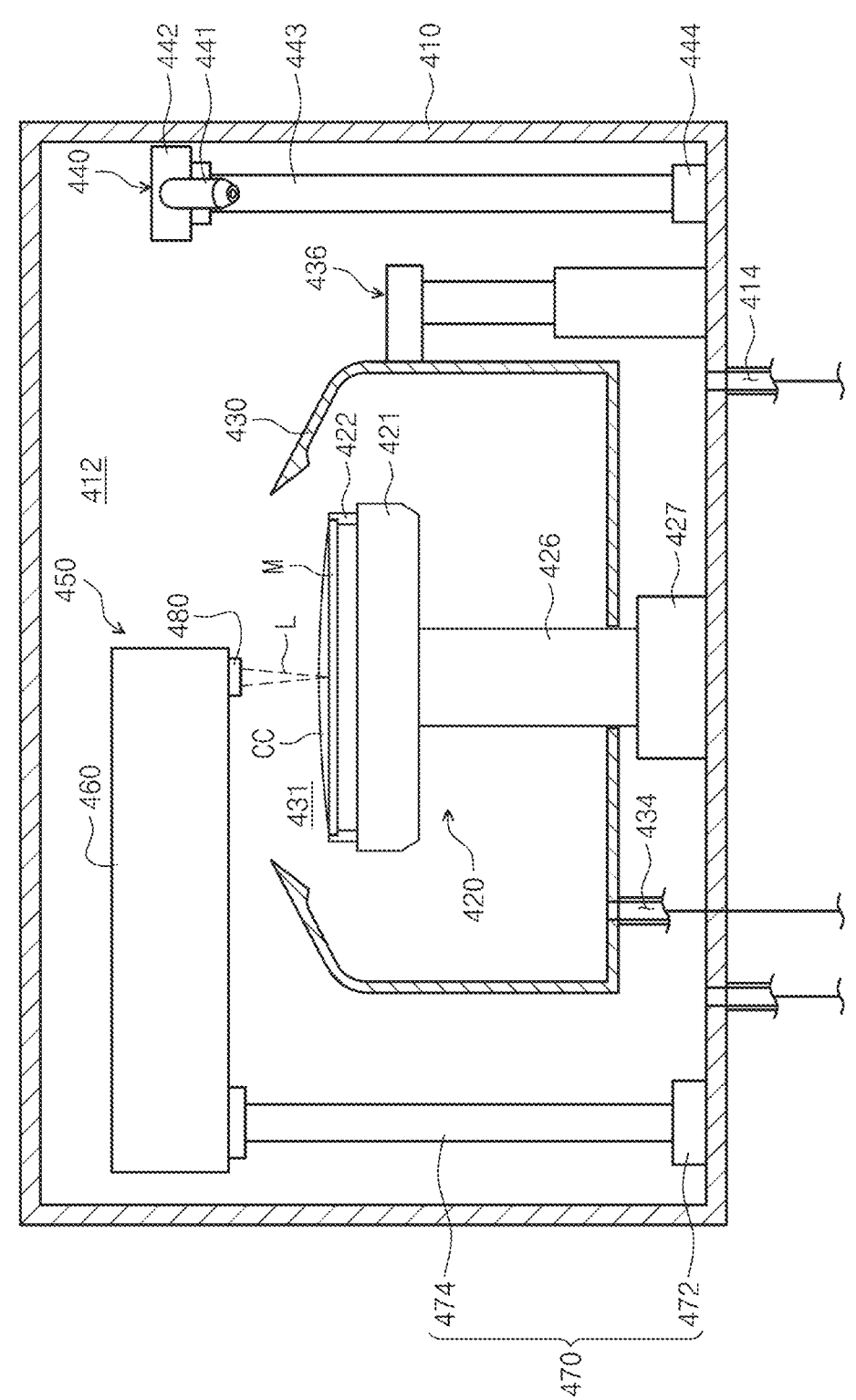
FIG. 10 is a diagram illustrating the substrate treating apparatus performing a heating operation according to the exemplary embodiment of FIG. 8.

FIG. 10 is a diagram illustrating the substrate treating apparatus performing the heating operation according to the exemplary embodiment of FIG. 8. Referring to FIG. 10, in the heating operation S24, the liquid supply unit 440 may move from the process position to the standby position, and the laser unit 450 may move from the standby position to the process position.

In the heating operation S24, the substrate M may be heated by emitting the laser L to the substrate M. In the heating operation S24, the substrate M may be heated by emitting the laser L to the substrate M on which a liquid film CC is formed. In the heating operation S24, the laser L may be emitted to a specific region of the substrate M. The temperature of the specific region irradiated with the laser L may rise. For example, in the heating operation S24, the laser L may be emitted to the second pattern P2 between the first pattern P1 and the second pattern P2 formed on the substrate (M).

By irradiating the second pattern P2 with the laser L, the temperature of the region where the second pattern P2 is formed may increase, and the etching rate of the second pattern P2 by the chemical C may increase. Accordingly, the critical dimension of the first pattern P1 may be changed from a first critical dimension (for example, 69 nm) to a target critical dimension (for example, 70 nm). Further, the critical dimension of the second pattern P2 may be changed from a second critical dimension (for example, 68.5 nm) to the target critical dimension (for example, 70 nm). That is, in the heating operation S24, the critical dimension deviation of the pattern formed on the substrate M may be minimized by improving the etching ability of the partial region of the substrate M.

Figure 11:
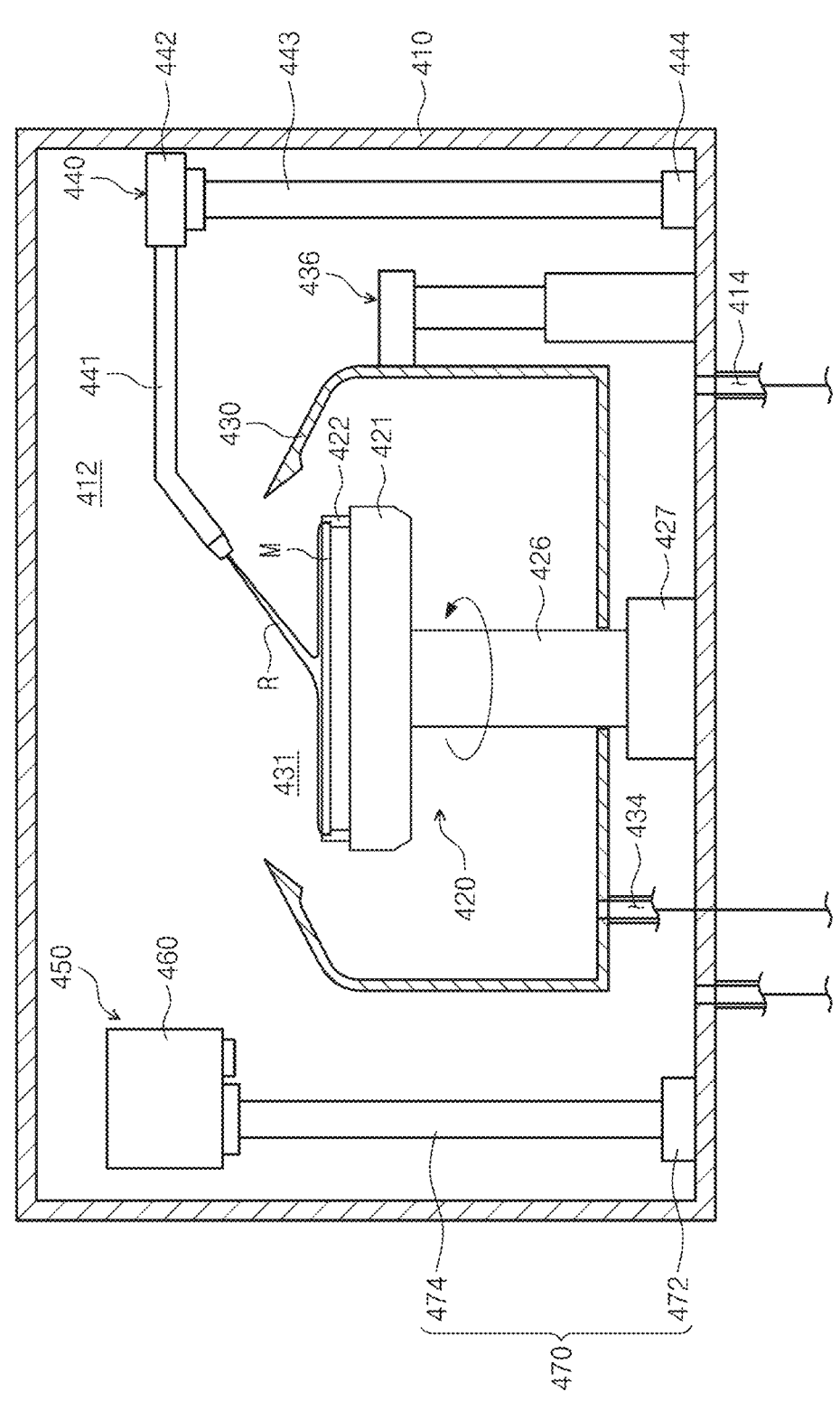
FIG. 11 is a diagram illustrating the substrate treating apparatus performing a rinsing operation according to the exemplary embodiment of FIG. 8.

FIG. 11 is a diagram illustrating the substrate treating apparatus performing the rinsing operation according to the exemplary embodiment of FIG. 8. Referring to FIG. 11, in the rinsing operation S26, the liquid supply unit 440 may move from the standby position to the process position again, and the laser unit 450 may move from the process position to the standby position.

The rinsing operation S26 removes impurities (byproduct) generated in the liquid treating operation S22 and the heating operation S24 from the substrate M. In the rinsing operation S26, the liquid supply unit 440 may supply a rinsing solution R to the rotating substrate M. In the rinsing operation S26, impurities attached onto the substrate M may be removed by supplying the rinsing solution R to the substrate M. In addition, if necessary, the support unit 420 may remove the rinsing solution R remaining on the substrate M by rotating the substrate M at a high speed in order to dry the rinsing solution R remaining on the substrate M.

Figure 12:
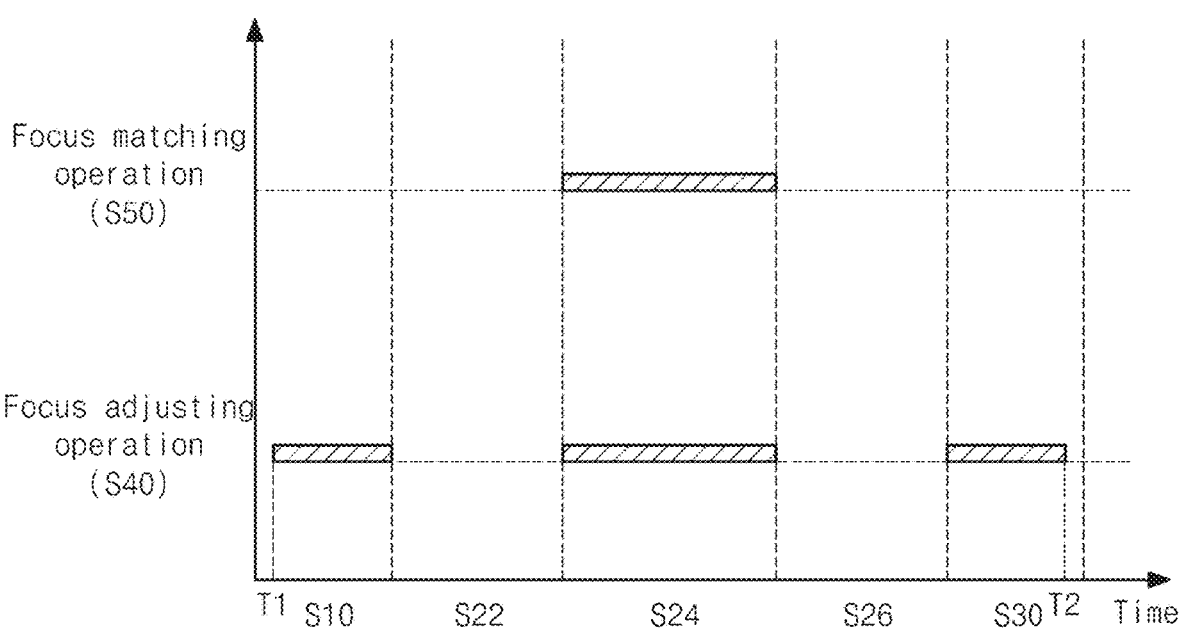
FIG. 12 is a diagram schematically illustrating a section in which a focus adjusting operation and a focus matching operation according to the exemplary embodiment are performed while performing the substrate treating method according to the exemplary embodiment of FIG. 8.

FIG. 12 is a diagram schematically illustrating a section in which a focus adjusting operation and a focus matching operation according to the exemplary embodiment are performed while performing the substrate treating method according to the exemplary embodiment of FIG. 8. Referring to FIG. 12, the substrate treating method according to the exemplary embodiment of the present invention may include a focus adjusting operation S40 and a focus matching operation S50. In the focus adjusting operation S40, the substrate M may be imaged. In the focus adjusting operation S40, a region including patterns formed on the substrate M may be captured, and an image of the region may be obtained. Also, in the focus adjusting operation S40, the focus of the imaging light on the top surface of the substrate M may be adjusted. For example, when a liquid film is formed on the top surface of the substrate M, in the focus adjusting operation S40, the focus may be adjusted with respect to the top surface of the substrate M between the top surface of the substrate M and the liquid film.

As illustrated in FIG. 12, the focus adjusting operation S40 may be performed in the section in which the substrate loading operation S10, the heating operation S24, and the substrate unloading operation S30 of the substrate treating method according to the exemplary embodiment of the present invention are performed. According to the exemplary embodiment, when the substrate M is seated on the support unit 420 at a first time point T1 of the substrate loading operation S10, the focus adjusting operation S40 may be performed from the first time point T1 before the liquid treating operation S22. In addition, the focus adjusting operation S40 may be performed in all sections in which the heating operation S24 is performed. In addition, when the substrate M is separated from the support unit 420 at a second time point T2 of the substrate unloading operation S30, the focus adjusting operation S40 may be performed to the second time point T2 after the rinsing operation S26 is completed.

However, unlike the above, the focus adjusting operation S40 may also be performed in the liquid treatment operation S22 and the rinsing operation S26. For example, in the focus adjusting operation S40, the laser unit 450 is moved to image the substrate M within a range that does not interfere with the liquid supply unit 440 illustrated in FIGS. 4 and 5, and the focus to the substrate M may also be adjusted.

In the focus matching operation S50, a divergence angle of the laser emitted from the head lens 480 illustrated in FIGS. 4 to 7 may be matched with a divergence angle of the imaging light. The focus matching operation S50 may be performed during the heating operation S24 of the substrate treating method according to the exemplary embodiment of the present invention. A detailed mechanism for the focus matching operation S50 will be described later.

Figure 13:
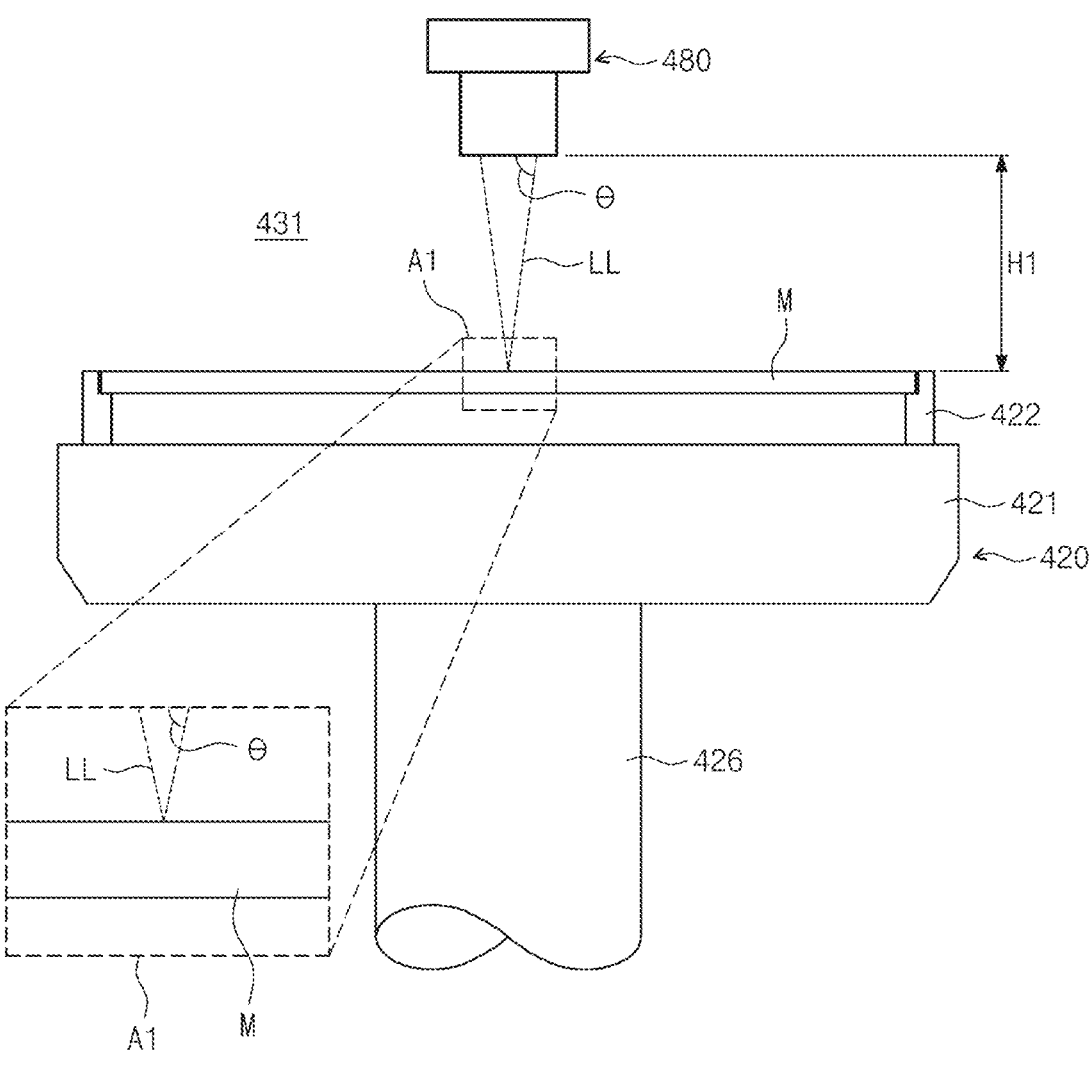
FIGS. 13 to 15 are partially enlarged views of the substrate treating apparatus performing a focus adjusting operation according to the exemplary embodiment of FIG. 12.
Figure 14:
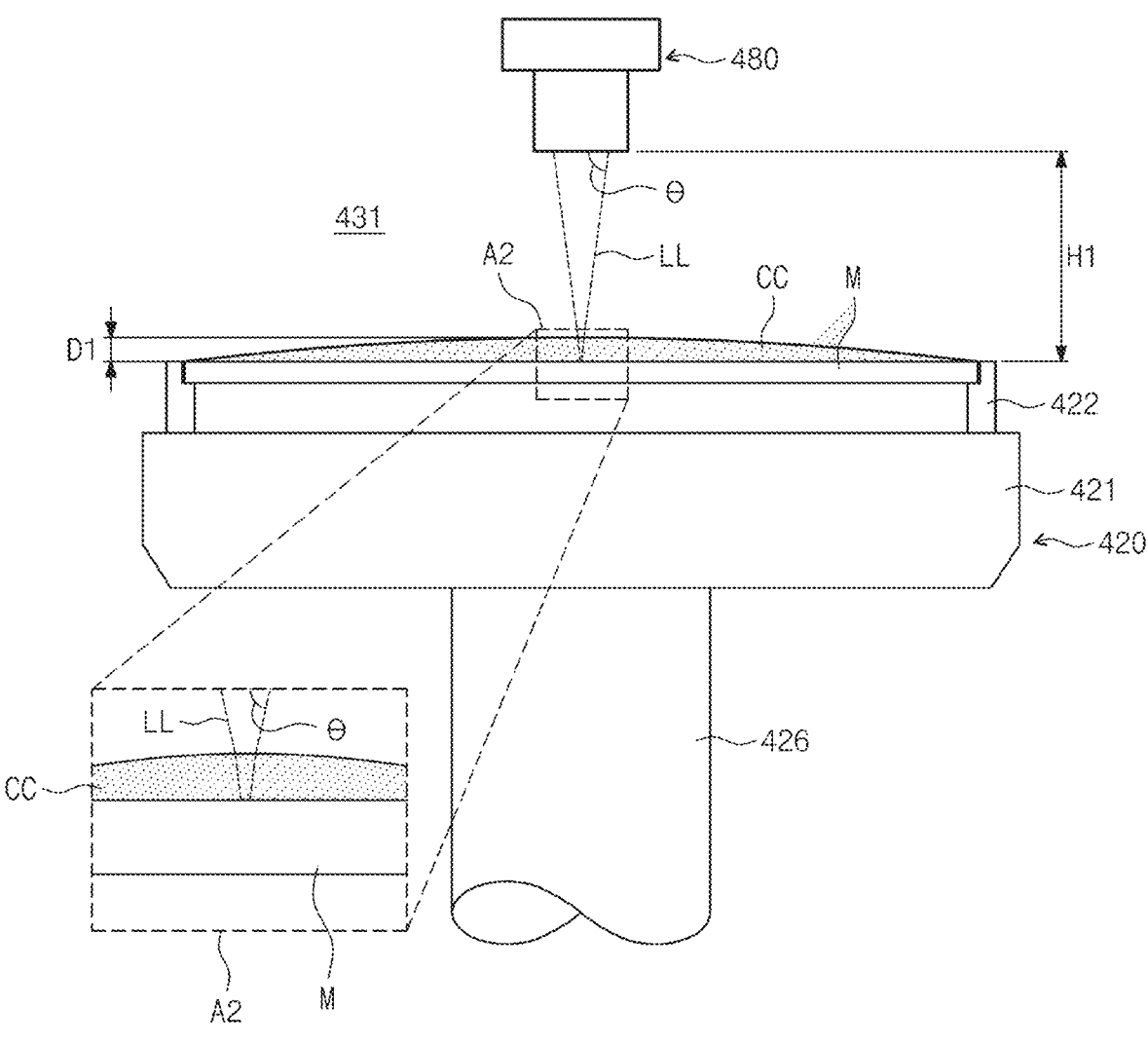
Figure 15:
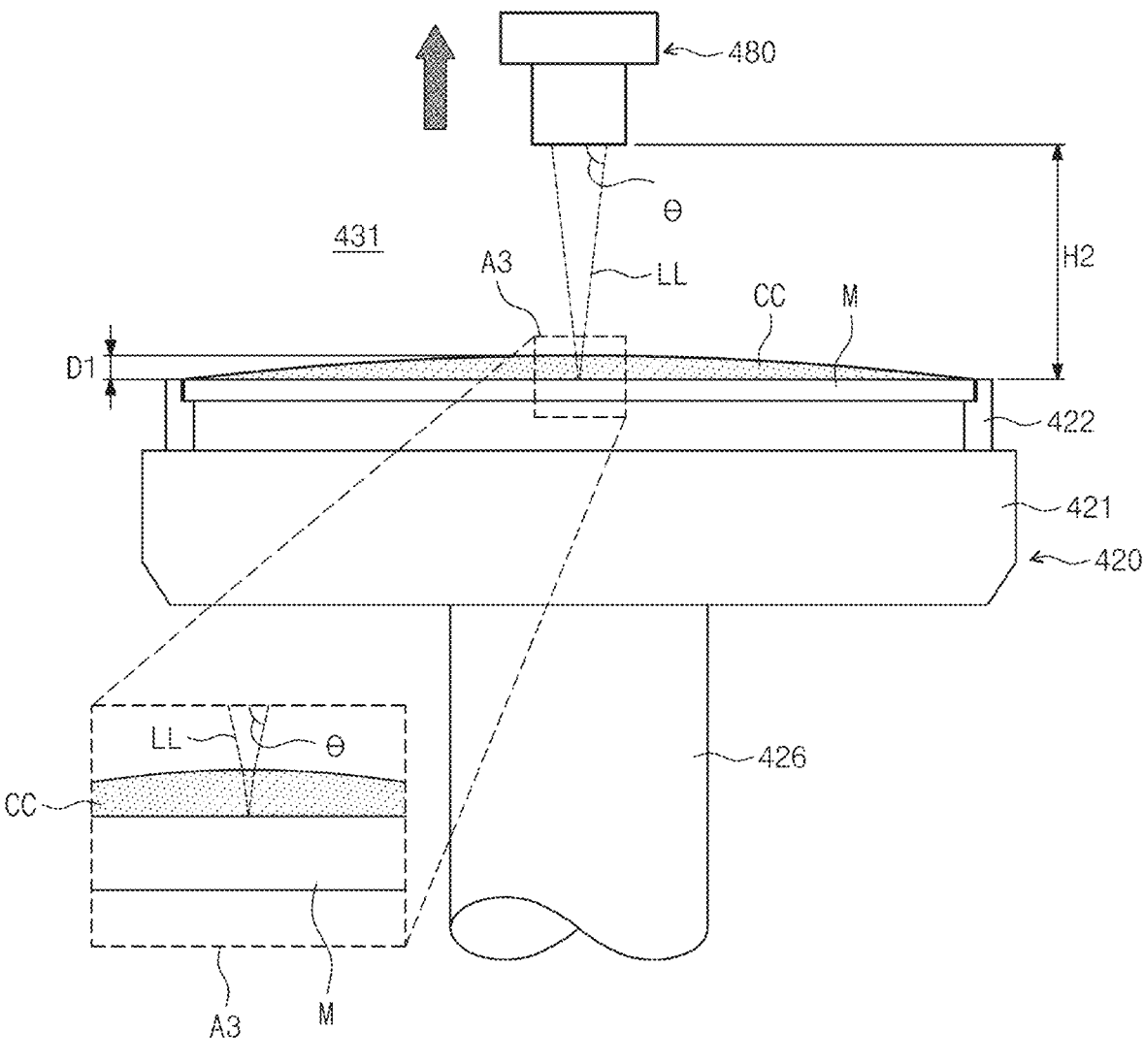

FIGS. 13 to 15 are partially enlarged views of the substrate treating apparatus performing the focus adjusting operation according to the exemplary embodiment of FIG. 12. Hereinafter, the focus adjusting operation according to the exemplary embodiment of the present invention will be described in detail with reference to FIGS. 13 to 15.

Hereinafter, the substrate M illustrated in FIG. 13 is defined as the substrate M before the liquid treating operation S22 described with reference to FIG. 9 is performed, the substrate M illustrated in FIG. 14 is defined as the substrate M at a specific time in the heating operation S24 described with reference to FIG. 10, and the substrate M illustrated in FIG. 15 is defined as the substrate M immediately after performing the focus adjusting operation S40 according to the exemplary embodiment from the specific time of FIG. 14.

However, this is only defined for convenience of understanding, and as described above, the focus adjusting operation S40 and the imaging of the substrate M may be continuously performed in the substrate loading operation S10, the heating operation S24, and the substrate unloading operation S30. Optionally, the focus adjusting operation S40 and the imaging of the substrate M may be performed in all sections of performing the substrate treating method according to the exemplary embodiment of the present invention.

Referring to FIG. 13, after the substrate M is seated on the support unit 420 and before the liquid treating operation S22 is performed, the head lens 480 may move from a standby position to a process position. In order to grasp the state of the substrate M after the pre-treatment is completed, the head lens 480 may emit the imaging light LL toward the substrate M, and the imaging member 700 illustrated in FIG. 6 may obtain the image of the substrate M.

When viewed from above, the head lens 480 may be located at a position overlapping the region where the second pattern P2 illustrated in FIG. 3 is formed. Unlike this, the head lens 480 may emit the imaging light LL while moving the entire upper surface area of the substrate M, and obtain the image of the entire area of the substrate M therefrom. The state of the pre-processed substrate M may be monitored from the obtained image.

According to the exemplary embodiment, a divergence angle θ of the imaging light LL may be a value stored in the controller 30. According to the exemplary embodiment, the divergence angle θ of the imaging light LL stored in the controller 30 may be a fixed value. That is, the divergence angle θ of the imaging light LL emitted from the head lens 480 to the substrate M may not change. For example, the divergence angle θ of the imaging light LL emitted from the head lens 480 to the substrate M may have a fixed value in all operations of performing the substrate treating method.

According to the exemplary embodiment, the bottom surface of the head lens 480 may be positioned at a first height H1 from the top surface of the substrate M supported by the support unit 420. When the head lens 480 is positioned above a home port (not illustrated) in a standby position, a value for the first height H1 may be set. For example, as in the enlarged view of the portion A1 irradiated with the imaging light LL in FIG. 13, the first height H1 may be a height at which the focus of the imaging light LL with respect to the top surface of the substrate M is adjusted in the state where the divergence angle θ of the imaging light LL emitted from the head lens 480 is fixed. Accordingly, the imaging member 700 illustrated in FIG. 6 may obtain a clear image of the top surface of the substrate M whose focus is adjusted. Thus, the controller 30 may efficiently monitor the pre-treatment state of the patterns formed on the top surface of the substrate M.

Referring to FIG. 14, a liquid film CC may be formed on the top surface of the substrate M at a specific time when the heating operation S24 according to the exemplary embodiment described with reference to FIG. 10 is performed. That is, as defined, since the substrate M supported by the support unit 420 is the substrate M after the liquid treating operation S22 described with reference to FIG. 9 is completed, a liquid film CC having a first thickness D1 may be formed on the top surface of the substrate M.

The imaging light LL emitted from the head lens 480 passes through the treating space 431 and the liquid film CC. That is, the treating space 431 and the liquid film CC are provided as part of a moving path of the imaging light LL. Since the liquid film CC formed on the top surface of the substrate M is made of a chemical, the media of the treating space 431 and the liquid film CC may be different from each other. For example, the liquid film CC may be a relatively dense medium than the treating space 431.

As described in FIG. 13, when the bottom surface of the head lens 480 is located at the first height H1 from the top surface of the substrate M in a state where the liquid film CC is not formed on the substrate M, the focus of the imaging light LL having the fixed divergence angle θ with respect to the top surface of the substrate M is adjusted. Unlike this, as illustrated in FIG. 14, when the bottom surface of the head lens 480 is located at the first height H1 from the top surface of the substrate M, the imaging light LL having the fixed divergence angle θ may be refracted by the liquid film CC formed on the top surface of the substrate M, so that the focus on the top surface of the substrate M may not be adjusted. Since the focus of the imaging light LL with respect to the top surface of the substrate M is not adjusted, it is difficult to obtain a clear image of the substrate M including the region where the pattern is formed.

Accordingly, the head lens 480 may be moved to the position where the focus with respect to the top surface of the substrate M is adjusted. For example, the moving member 470 illustrated in FIGS. 4 and 5 moves the housing 460 and the head lens 480 inserted into the housing 460 may move. For example, the head lens 480 may move in the upward or downward direction to change the distance from the top surface of the substrate M.

As described with reference to FIG. 14, the treating space 431 and the liquid film CC provided as part of the moving path of the imaging light LL may be refracted when the imaging light LL passes through the liquid film CC in the treating space 431 and is emitted to the top surface of the substrate M due to the difference in the medium between the treating space 431 and the liquid film CC. For example, since the liquid film CC is provided as a relatively dense medium than the treating space 431, the focus of the imaging light LL is positioned below the top surface of the substrate M. Accordingly, as illustrated in FIG. 15, the bottom surface of the head lens 480 may be moved to a position separated from the top surface of the substrate M by a second height H2. The second height H2 may have a relatively greater value than the first height H1. That is, the bottom surface of the head lens 480 may move to the position where the focus of the imaging light LL with respect to the top surface of the substrate M is adjusted.

According to the exemplary embodiment of the present invention described above, in the focus adjusting operation S40, the focus of the imaging light LL with respect to the substrate M may be adjusted by emitting the imaging light LL having the fixed divergence angle θ to the substrate M and changing the distance between the bottom surface of the head lens 480 to which the imaging light LL is emitted and the top surface of the substrate M.

According to the exemplary embodiment of the present invention, the focus matching operation S50 may be performed while the heating operation S24 is performed. Also, the focus matching operation S50 may be performed while the focus adjusting operation S40 is performed.

In the focus matching operation S50, the divergence angle of the laser emitted from the oscillating unit 520 illustrated in FIG. 6 and emitted from the head lens 480 to the substrate M is adjusted to match the divergence angle θ of the imaging light LL emitted from the head lens 480. For example, in the focus matching operation S50, the divergence angle of the laser emitted from the head lens 480 may be matched to the divergence angle θ of the imaging light LL emitted from the head lens 480. For example, the controller 30 may adjust the relative distances of the plurality of lenses 542, 544, and 546 illustrated in FIG. 6 and change the divergence angle of the laser emitted from the head lens 480 to match the divergence angle θ of the imaging light LL.

Since the divergence angles of the imaging light LL emitted from the head lens 480 and the laser are the same, when the focus of the imaging light LL is adjusted with respect to the top surface of the substrate M, the focus of the laser may also be adjusted with respect to the top surface of the substrate M.

According to the above-described exemplary embodiment of the present invention, the focus of the imaging light LL emitted to the substrate M may be precisely adjusted based on the top surface of the substrate M while the substrate treating method is performed. In addition, the focus of the laser emitted to the substrate M is matched with the focus of the imaging light LL, so that the focus of the laser may also be precisely adjusted with respect to the top surface of the substrate M through a single mechanism for adjusting the focus of the imaging light LL. Accordingly, in the critical dimension correction process that does not allow an error of several nm, it is possible to precisely etch the specific pattern (for example, the second pattern P2) formed on the substrate M.

In addition, even when the liquid film CC is formed on the top surface of the substrate M and the focus of the imaging light LL is refracted by the liquid film CC, the focus of the imaging light LL with respect to the top surface of the substrate M may be accurately adjusted by moving the head lens 480 in the state where the divergence angle of the imaging light LL emitted from the head lens 480 is fixed.

During the above-described heating operation S24, the liquid film CC may be partially evaporated and removed by the laser emitted to the substrate M. Accordingly, the thickness of the liquid film CC formed on the substrate M varies. When the thickness of the liquid film CC is changed, the refractive index of the imaging light LL moving from the treating space 431 to the liquid film CC is also changed. By adjusting the focus of the imaging light LL with respect to the top surface of the substrate M according to the change in the refractive index of the imaging light LL due to the change in the thickness of the liquid film CC, the focus of the laser whose divergence angle is matched with that of the imaging light LL may also be adjusted with respect to the top surface of the substrate M. Accordingly, even when the thickness of the liquid film CC formed on the substrate M changes, it is possible to precisely etch the specific pattern formed on the substrate M (for example, the second pattern P2).

Figure 16:
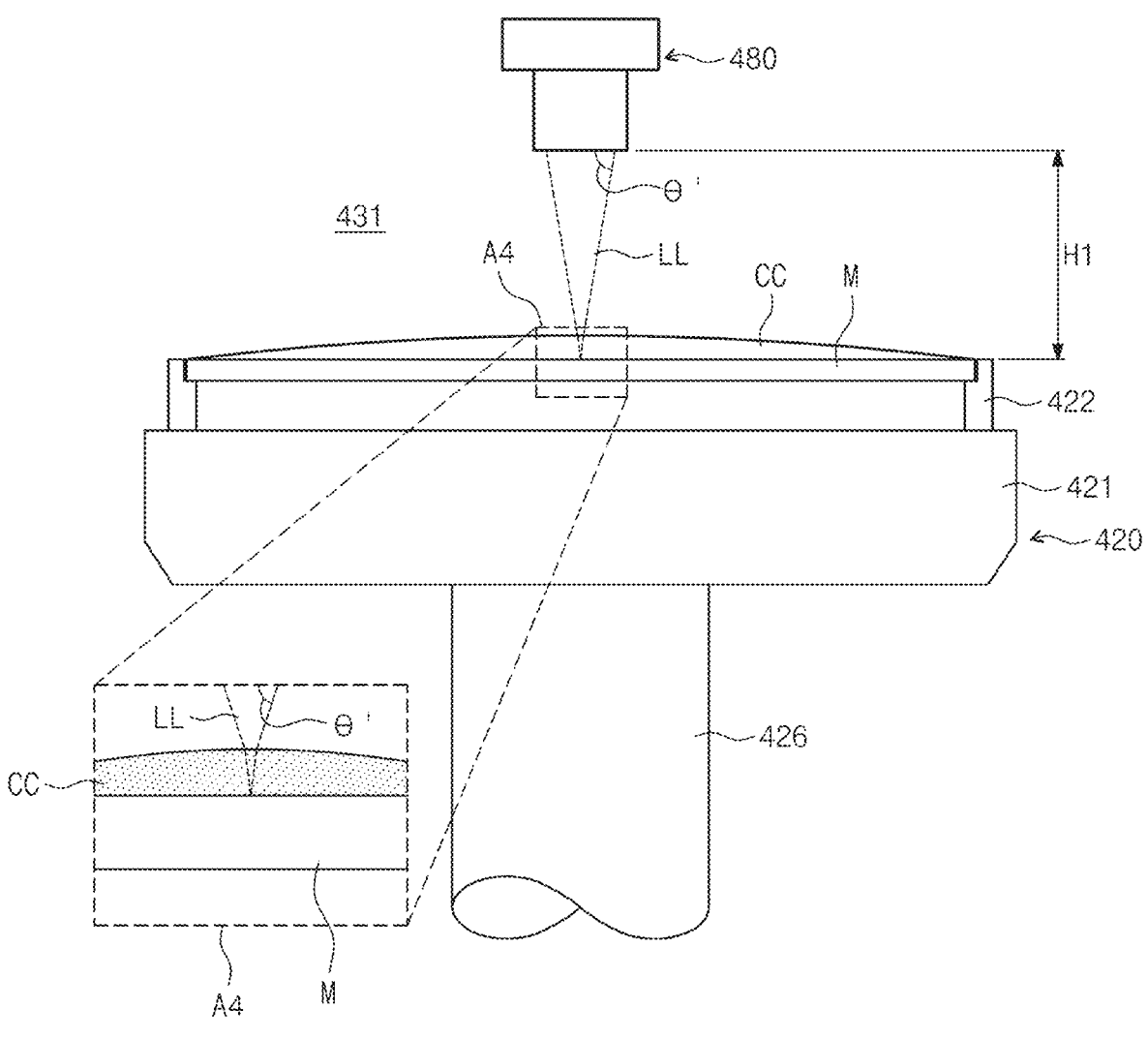
FIG. 16 is a partially enlarged view of the substrate treating apparatus performing the focus adjusting operation according to another exemplary embodiment of FIG. 12.

FIG. 16 is a partially enlarged view of the substrate treating apparatus performing the focus adjusting operation according to another exemplary embodiment of FIG. 12. The substrate M supported by the support unit 420 illustrated in FIG. 16 may be the substrate M immediately after the focus adjusting operation S40 according to the exemplary embodiment is performed from the specific time in FIG. 14.

In the focus adjusting operation S40, the head lens 480 may be fixed to the first height H1. In the focus adjusting operation S40, the vertical position of the head lens 480 may not be changed. For example, in the focus adjusting operation S40, the head lens 480 may move in a horizontal direction, but may not move in a vertical direction.

In the focus adjusting operation S40, the divergence angle of the imaging light LL emitted from the head lens 480 may be changed. That is, in the focus adjusting operation S40, the divergence angle of the imaging light LL emitted from the head lens 480 may be adjusted based on the top surface of the substrate M.

As illustrated in FIG. 15, in the focus adjusting operation S40 according to the exemplary embodiment of the present invention, in a state in which the liquid film CC is not formed on the substrate M described with reference to FIGS. 13 and 14, the emitting light LL may be provided to have a divergence angle θ' that is relatively smaller than the divergence angle θ of the imaging light LL whose focus is adjusted with respect to the top surface of the substrate M. Accordingly, when the liquid film CC is formed on the substrate M, the focus of the imaging light LL may be adjusted based on the top surface of the substrate M. Also, even when the thickness of the liquid film CC formed on the substrate M is changed, the focus of the imaging light LL emitted from the head lens 480 may be adjusted based on the top surface of the substrate M.

In the focus matching operation S50, the divergence angle of the laser emitted from the oscillating unit 520 illustrated in FIG. 6 and emitted from the head lens 480 to the substrate M may be matched to the divergence angle θ of the imaging light LL emitted from the head lens 480. For example, when the divergence angle θ of the imaging light LL in the state in which the liquid film CC is not formed on the substrate M in the focus adjusting operation S40 is changed to the divergence angle θ' of the imaging light LL in the state in which the liquid film CC is formed on the substrate M, in the focus matching operation S50, the divergence angle of the laser emitted from the head lens 480 may be changed to be the same as the divergence angle θ' of the imaging light LL in the state in which the liquid film CC is formed on the substrate M.

Even when the liquid film CC is formed on the top surface of the substrate M and the focus of the imaging light LL is refracted by the liquid film CC, the focus of the imaging light LL with respect to the top surface of the substrate M may be accurately adjusted by changing the divergence angle of the imaging light LL emitted from the head lens 480 in the state where the height of the head lens 480 is not changed. Thereafter, by matching the divergence angle of the laser emitted from the head lens 480 to the changed divergence angle of the imaging light LL, the focus of the laser may be adjusted with respect to the top surface of the substrate M. The focus of the imaging light LL emitted to the substrate M and the focus of the laser may be precisely adjusted based on the top surface of the substrate M while the substrate treating method is performed. Accordingly, even when the thickness of the liquid film CC formed on the substrate M changes, it is possible to precisely etch the specific pattern formed on the substrate M (for example, the second pattern P2).

Although the present invention has been described based on the case where the treating process performed in the liquid treating chamber 400 performs the critical dimension correction process in the process of manufacturing the mask for the exposure process as an example, but is not limited thereto. For example, an object to be processed in the liquid treating chamber 400 may be provided as a wafer or glass. Also, the process processed in the liquid treating chamber 400 may be any one process except for the critical dimension correction process in the processes of manufacturing the mask. In addition, the process processed in the liquid treating chamber 400 may include various processes using a liquid, such as a cleaning process or a photo process, in addition to an exposure process.

In the above-described exemplary embodiment of the present invention, the present invention has been described based on the case where the etch rate of the second pattern P2 is improved in the substrate M having the first pattern P1 that is the monitoring pattern for monitoring the exposure pattern and the second pattern P2 that is the pattern for setting conditions for treating the substrate as an example. However, unlike this, the functions of the first pattern P1 and the second pattern P2 may be different from those of the above-described exemplary embodiment of the present invention. In addition, according to the exemplary embodiment of the present invention, only one of the first pattern P1 and the second pattern P2 is provided, and an etch rate of the one pattern provided between the first pattern P1 and the second pattern P2 may be improved. In addition, according to the exemplary embodiment of the present invention, the same may be applied to improve an etch rate of a specific region in a substrate, such as a wafer or glass, other than a photomask.

In addition, the treating module 20 described with reference to FIG. 2 may further include a drying chamber (not illustrated). The drying chamber (not illustrated) may be disposed on the side of the transfer frame 300 illustrated in FIG. 2. In a drying chamber (not illustrated), the substrate M after the rinsing operation S26 described with reference to FIG. 11 may be dried. For example, in the drying chamber (not illustrated), the rinsing solution R remaining on the substrate M may be removed.

The foregoing detailed description illustrates the present invention. Further, the above content illustrates and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. Further, the accompanying claims should be construed to include other exemplary embodiments as well.

What is claimed is:

1. A substrate treating method, comprising:
supplying a liquid to the substrate, emitting a laser to the substrate supplied with the liquid to heat the substrate, and emitting imaging light for capturing the substrate to obtain an image of the substrate including a region to which the laser is emitted,
wherein the laser and the imaging light are emitted to the substrate through a head lens, and a divergence angle of the laser emitted from the head lens and a divergence angle of the imaging light are matched with each other.

2. The substrate treating method of claim 1, wherein the liquid is supplied to the substrate to form a liquid film, and the laser is emitted to the substrate on which the liquid film is formed, and
a focus of the imaging light is adjusted based on the substrate between the substrate and the liquid film.

3. The substrate treating method of claim 2, wherein the head lens is movably provided, and
a focus of the imaging light is adjusted by moving the head lens to change a distance between the head lens and an top surface of the substrate.

4. The substrate treating method of claim 2, wherein the focus of the imaging light is adjusted by changing the divergence angle of the imaging light emitted from the head lens.

5. The substrate treating method of claim 4, wherein the divergence angle of the laser emitted from the head lens is changed by an expander, and
the divergence angle of the laser emitted from the head lens is changed by the expander to be matched to the changed divergence angle of the imaging light.

6. The substrate treating method of claim 1, wherein a direction of the laser emitted from the head lens to the substrate and a direction of the imaging light emitted from the head lens to the substrate are coaxial with each other.

7. A substrate treating method of treating a mask including a plurality of cells, the substrate treating method comprising:
supplying a liquid to a mask in which a first pattern is formed in the plurality of cells and a second pattern different from the first pattern is formed outside the region where the cells are formed, heating the mask by emitting a laser to the mask supplied with the liquid, and obtaining an image of the mask including a region irradiated with the laser by emitting imaging light for capturing the mask,
wherein the laser and the imaging light are emitted to the substrate through a head lens, and a divergence angle of the laser emitted from the head lens and a divergence angle of the imaging light are matched with each other.

8. The substrate treating method of claim 7, wherein a liquid film is formed by supplying the liquid to the mask, and the laser is emitted to the mask formed with the liquid film, and
a focus of the imaging light is adjusted based on the mask between the mask and the liquid film.

9. The substrate treating method of claim 8, wherein the head lens is movably provided, and
the focus of the imaging light is adjusted by moving the head lens to change a distance between the head lens and an upper surface of the mask.

10. The substrate treating method of claim 8, wherein the focus of the imaging light is adjusted by changing the divergence angle of the imaging light emitted from the head lens.

11. The substrate treating method of claim 10, wherein the divergence angle of the laser emitted from the head lens is changed by an expander, and
the divergence angle of the laser emitted from the head lens is changed by the expander to be matched to the changed divergence angle of the imaging light.

12. The substrate treating method of claim 7, wherein a direction of the laser emitted from the head lens to the substrate and a direction of the imaging light emitted from the head lens to the substrate are coaxial with each other.

13. The substrate treating method of claim 7, wherein the laser is emitted to the second pattern between the first pattern and the second pattern.

* * * * *